(12) United States Patent
Hongo et al.

(10) Patent No.: US 7,089,032 B2
(45) Date of Patent: Aug. 8, 2006

(54) RADIO TRANSMITTING/RECEIVING DEVICE

(75) Inventors: Toyohiko Hongo, Musashimurayama (JP); Toshinori Hirashima, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 385 days.

(21) Appl. No.: 10/297,800

(22) PCT Filed: Aug. 20, 2001

(86) PCT No.: PCT/JP01/07111

§ 371 (c)(1),
(2), (4) Date: Dec. 10, 2002

(87) PCT Pub. No.: WO02/17502

PCT Pub. Date: Feb. 28, 2002

(65) Prior Publication Data

US 2003/0143971 A1 Jul. 31, 2003

(30) Foreign Application Priority Data

Aug. 22, 2000 (JP) ............................. 2000-255736

(51) Int. Cl.
*H04M 1/00* (2006.01)
(52) U.S. Cl. ................. 455/550.1; 455/127.4; 455/128; 455/323; 455/347; 455/349; 333/17.4; 333/124
(58) Field of Classification Search ................ 455/313, 455/341, 90.3, 575.1, 80–84, 76–78, 73, 455/269, 297, 550.1, 95, 88, 128, 293, 397, 455/127.4, 349, 323, 325, 333, 338; 333/17.3, 333/118–124, 101–104, 700 MS; 297/690–697
See application file for complete search history.

(56) References Cited

U.S. PATENT DOCUMENTS

| | | | | | |
|---|---|---|---|---|---|
| 5,400,039 | A | * | 3/1995 | Araki et al. | 343/700 MS |
| 5,854,480 | A | * | 12/1998 | Noto | 235/492 |
| 5,903,239 | A | * | 5/1999 | Takahashi et al. | 343/700 MS |
| 5,903,820 | A | * | 5/1999 | Hagstrom | 455/82 |
| 5,999,832 | A | * | 12/1999 | Vannatta et al. | 455/575.1 |
| 6,329,949 | B1 | * | 12/2001 | Barnett et al. | 343/700 MS |
| 6,339,385 | B1 | * | 1/2002 | Tuttle | 340/825.71 |
| 6,366,764 | B1 | * | 4/2002 | Yang et al. | 455/73 |
| 6,417,460 | B1 | * | 7/2002 | Cheng | 174/255 |
| 6,442,380 | B1 | * | 8/2002 | Mohindra | 455/234.1 |

(Continued)

FOREIGN PATENT DOCUMENTS

JP 1-300718 12/1989

(Continued)

OTHER PUBLICATIONS

Nikkei Electronics, Jan. 13, 1997, (No. 680), pp. 15-16.

(Continued)

*Primary Examiner*—Pablo N. Tran
(74) *Attorney, Agent, or Firm*—Mattingly, Stanger, Malur & Brundidge, P.C.

(57) ABSTRACT

A radio transmitting/receiving device having at least three modules. The first module includes a first function for amplifying a radio frequency signal, demodulating the amplified radio frequency signal to a baseband signal and outputting the same, and a second function for modulating the input baseband signal, converting the modulated baseband signal to a radio frequency and outputting the same. The second module includes a function for amplifying the input radio frequency. The third module includes a function for executing a baseband signal process and controlling respective units according to a transmission/reception sequence based on a communication protocol.

8 Claims, 21 Drawing Sheets

U.S. PATENT DOCUMENTS

| | | | | |
|---|---|---|---|---|
| 6,462,620 B1 * | 10/2002 | Dupuis et al. | ............... | 330/264 |
| 6,477,388 B1 * | 11/2002 | Schmutz | ...................... | 455/522 |
| 6,483,398 B1 * | 11/2002 | Nagamori et al. | ........... | 333/116 |
| 6,624,509 B1 * | 9/2003 | Takikawa et al. | ............ | 257/692 |
| 6,640,429 B1 * | 11/2003 | Sasaki | .......................... | 29/830 |
| 6,693,593 B1 * | 2/2004 | Burgess | ................ | 343/700 MS |
| 6,697,603 B1 * | 2/2004 | Lovinggood et al. | ....... | 455/13.1 |
| 6,771,475 B1 * | 8/2004 | Leete | ........................... | 361/56 |
| 6,809,688 B1 * | 10/2004 | Yamada | ................ | 343/700 MS |

FOREIGN PATENT DOCUMENTS

| | | |
|---|---|---|
| JP | 5-183328 | 7/1993 |
| JP | 5-344024 | 12/1993 |
| JP | 10-23175 | 1/1998 |
| JP | 11-145325 | 5/1999 |
| JP | 2001-24541 | 1/2001 |

OTHER PUBLICATIONS

Nikkei Electronics, Jul. 26, 1999, (No. 748), pp. 140-153.

* cited by examiner

RADIO TRANSMITTING/RECEIVING DEVICE

TECHNICAL FIELD

The present invention relates to a radio transmitting/receiving device built in, for example, a digital cellular phone, or a personal digital assistance such as a radio communication I/O card or the like.

BACKGROUND ART

A cellular phone of our country has been put into practical use together with a mobile telephone having a volume of 6800 cm$^3$ and a weight of 7 kg. It can be said that the development of a cellular phone is the history of pursuit of a reduction in size and weight thereof since the commencement of cellular telephony services in 1987. The greatest contribution to the reduction in size and weight of the cellular phone used up to now resides in a size reduction concerning parts. In particular, a great contribution has been made to a size reduction concerning high-frequency parts. Further, an advantageous effect has been brought about in that surface mounting of parts has been put forward and surface-mounting type parts other than the high-frequency parts have been also reduced in size. They have been yielded from the result that an attempt has been made to bring a high-frequency circuit into integration starting with a control-system circuit (baseband signal processing circuit), thereby covering major circuits with less-reduced LSI configurations.

As a package form of the above-described LSI, the adoption of a downsized and multi-pin configured BGA (Ball Grid Array), or CSP (Chip Size Package) has been put forward as an alternative to the conventional QFP (Quad Flat Package). The CSP is called an "ultimate package". This is because the CSP has both the good point of a bear chip and the good point of a package. Bear-chip mounting is excellent if only the size and weight reduction is taken into consideration. However, the adoption of the CSP has been put forward as a result that the cost, reliability, a framework to supply parts, etc. have been optimized totally.

The CSP varies widely but an external terminal form thereof can be regarded as a small-sized BGA arranged in area array form. It is estimated that minimum terminal pitches of both the BGA and CSP will be further narrowed from now on.

In order to mount multipin-configured/narrow-pitched/small-sized packages such as these BGA and CSP or the like, multilayering of a printed wiring board cannot be avoided either and hence the technology of forming small-diameter vias and fine patterns is essential. A build-up substrate characterized in that the limits of wiring pitches of a conventional substrate have been surmounted to reduce the diameter of each via and enhance the degree of freedom of a via layout, for example, and other high-density printed wiring board have been developed and put into practical use.

In 1996, the model, which has broken the barrier of a volume of 100 cm$^3$ and a weight of 100 g, has debuted as a domestic digital cellular phone but the adoption of the CSP has been started from this year. Thus, the adoption of a newly-developed high-density printed wiring board (a kind of build-up wiring board) becomes a key (NIKKEI ELECTRONICS 1997. 1. 13 (no. 680), PP. 15–16).

A high-frequency composite part (filter chip) obtained by integrally forming various passive parts C, R, L and the like in a ceramic green sheet multilayer structure is used in a portable terminal device. The integration of these passive parts has been effective even in, for example, enhancing reliability, taking measures against EMI, and reducing the cost of assembly of a device even in other than a size reduction (NIKKEI ELECTRONICS 1999. 7. 26 (no. 748), pp140–153).

From exclusive devotion to the size and weight reduction, a tendency to pursue various new functions has been made now while the size, weight, design and the like that many users are easy to accept, which have been achieved up to now, are being maintained. As trends in the building of various functions in a digital cellular phone may be mentioned, for example, the following ones:

(1) A dualband system and a dual mode system for expanding the limit of a call range and enhancing the convenience of a user have been put into practical use. Further, the introduction of a digital communication system which enables roaming (mobile connection) on a world scale, has been put forward.

(2) An Internet connecting function is provided and its expansion has been made.

(3) A device to which a new data communication standard "Bluetooth" has been mounted, has appeared.

(4) Enhancement of the function of reproducing sound and an image. Coping with a multimedia is made.

Owing to developments in high functioning of the cellular phone, as described above, there is a tendency to increase components including a semiconductor and increase current consumption with their increase. Further, a mounting space has been rendered small increasingly. Therefore, a semiconductor to be used has been required to take a further size and thickness reduction and a reduction in power consumption.

The radio transmitting/receiving function of the cellular phone has been applied to respective personal digital assistances using mobile communications. A cellular phone or a PHS is connected to put data communications, wireless internet, etc. into practical use. Further, the radio transmitting/receiving function has been incorporated into the respective personal digital assistances, and its demand has been increased. New-entry makers encounters difficulties in executing unaccustomed design of an RF/IF signal processing circuit of a communication circuit. These makers have a demand for a product obtained by bringing a high-frequency circuit unit into a module, and one obtained by bringing even some of a baseband signal processing circuit into integration and reducing its size.

As shown in FIG. 2, a configuration of a main circuit of a digital cellular phone is largely divided into a radio unit 100 (RF/IF signal processing circuit unit) which handles analog signals of several hundreds of MHz to a few GHz, and a control unit 200 (baseband signal processing circuit unit) which mainly treats with a digital signal.

Since the radio unit 100 (RF/IF signal processing circuit unit) of these handles the analog signals of several hundreds of MHz to a few GHz, parasitic capacitances of patterns and parts influence on circuit characteristics significantly. As a result, the performance of the device, such as an achievable distance of a wave emitted from a terminal, a receivable distance or the like will vary greatly. Therefore, a case-by-case correspondence must be inevitably taken each time a device is designed. Thus, experiences come into play. If the radio unit 100 (RF/IF signal processing circuit) is brought into a module fixed up on one printed wiring board or brought into one chip to enable its introduction, then a device maker unfamiliar with communication apparatuses is easy to design a high-frequency circuit.

Problems developed upon integration of the RF/IF signal processing circuit (radio unit 100) will be mentioned as follows:

(1) Since manufacturing processes increase, cost-down is difficult.

(2) If the cost of an LSI is taken into consideration, it is then desired to perform the integration thereof by a CMOS technology alone. There are known many LSIs using a bipolar technology up to now. In a device unit level using the CMOS technology even in the case of each input signal lying in a GHz band, ones are in the process of being developed in which high frequency characteristics are given as a level equivalent to or greater than a bipolar. Upon integration of these, crosstalk occurs between circuits and hence the performance is degraded.

(3) Passive parts such as a quartz oscillator and a filter are difficult to make integration into an LSI. When these passive parts are externally attached to the LSI, they produce the case that they are affected by noise or give it.

(4) A portion corresponding to an output power amplifier 130 is very high in power as in the case of 3W, 4W or the like, for example, and hence the substrate reaches a very high temperature even in a moment of time. The substrate rises to a temperature of about 130° C., for example. On the other hand, since the high temperature of 130° C. or the like is beyond the limit at a unit where a small signal is handled as in the case of an RF signal processing unit module 160 or the like of FIG. 19, the unit is separated from a functional module.

Next, an attempt to integrate the radio unit 100 (RF/IF signal processing circuit unit) and the control unit 200 (baseband signal processing circuit unit) principally handling the digital signal into the same chip will yield the following problems:

(1) Performance degradation in circuit due to crosstalk developed between a digital signal processing circuit and an analog signal processing circuit is of a large problem. It is necessary to carry out a contrivance of a part layout such as insertion of a ground layer into the corresponding circuit. A more effective measure is to adopt the process of allowing back gates of respective transistors to be completely separated. As a technology effective therefor, a triple wells, an SOI (Silicon On Insulator), etc. may be mentioned. However, the contrivance of the process will lead to a rise in cost.

(2) The control unit 200 (baseband signal processing circuit unit) makes use of a clock which ranges from about 50 MHz to about 200 MHz, for example, and results in a noise source at the side of the radio unit 100 (RF/IF signal processing circuit unit). Such a unit is not set together with the radio unit.

(3) A microcomputer 220, a DSP 211, a channel codec 214, etc. of the control unit 200 (baseband signal processing circuit unit) have a high potential for the occurrence of various specification changes in function. If they are potentially integrated into one chip, it is then not possible to promptly cope with specification changes. The cost rises upon the specification changes.

Although the problems have been presented as described above, it is estimated that the integration of the radio unit 100 (RF/IF signal processing circuit unit) and the control unit 200 (baseband signal processing circuit unit) has been put forward from now.

The LSI for the radio transmitting/receiving device is classified into four of GaAs, bipolar, Bi-CMOS and CMOS from the viewpoint of the manufacturing processes. Since there are upper limits of operating frequencies at their processes, the discrete processes are respectively used according to circuits to thereby design the LSI. However, it is not advisable under the present situation to manufacture a full custom LSI high in integration by the processes for GaAs and Bi-CMOS relatively high in cost from the viewpoint of economical efficiency and the period of development. Mixed-placing the different processes on the same chip is technically difficult except for Bi-CMOS and fails to match economically in most cases. A future trend is estimated to be consolidated into four types of chips using the respective processes.

Next, a method of packaging respective circuits and respective parts onto a printed circuit board (motherboard) involves the following problems:

(1) According to the load map of SIA (Semiconductor Industry Association of USA), which has been published in the end of 1997, the prediction or estimate of minimum terminal pitches of BGA/CSP/flip-chip device has been described in the following manner. In 1997, the IC minimum line width (nm)/BGA pitch (mm)/CSP pitch (mm)/flip-chip device pitch (mm) were respectively of 250 (nm)/1.0 (mm)/0.5 (mm)/0.25 (mm). In 2001, however, they resulted in 150 (nm)/0.8 (mm)/0.4 (mm)/0.15 (mm). Further, they are estimated to reach 100 (nm)/0.65 (mm)/0.3 (mm)/0.1 (mm) respectively in 2006, 70 (nm)/0.65 (mm)/0.25 (mm)/0.07 (mm) respectively in 2009, and 50 (nm)/0.5 (mm)/0.25 (mm)/0.05 (mm) respectively in 2012.

(2) Owing to the adoption of a buildup printed board provided with high-density wirings for enabling the packaging of BGA and CSP whose terminal narrow-pitching has been put forward, for the motherboard, all functions of a cellular phone could be mounted on a single printed wiring board. However, an area in which small-diameter vias, high-density wirings, fine patterns, narrowed land pitches and multilayering are necessary for the motherboard, corresponds to a partial area of the motherboard. A battery, an LCD, a key board, loud speakers, and a microphone or the like, which occupy the most part of an internal volume of the cellular phone, are mounted in other area directly or indirectly via connecting portions. The areas in which these parts are mounted and connected, need little provision of high-density wirings and a multilayer structure. Nevertheless, only a partial area of one printed wiring board cannot be enhanced in wiring density and changed in the number of layers as compared with other areas. Therefore, the whole wiring density and the total number of layers are determined according to a high wiring density and the maximum number of layers required for the partial area. This will incur a needless increase in the cost of the motherboard (printed wiring board).

In view of the above problems, present and future trends toward the integration of the LSI for the radio transmitting/receiving device do not necessarily lead to the integration of a single chip requested by customers. The integration thereof into a plurality of chips is considered. Further, the respective LSIs are expected to result in a CSP which is increasingly multi-functioned, multipin-configured and narrow-pitched, and a packaging form set in a flip-chip format.

The invention of the present application aims to propose the form of supply of components of a radio transmitting/receiving device, wherein a user who introduces components estimated to become increasingly downsized and narrow-pitched, to thereby configure the corresponding radio transmitting/receiving device, is able to configure the corresponding radio transmitting/receiving device even on a motherboard relatively low in cost and held in low-layer/low wiring density, without preparing an expensive motherboard held in multilayer/high wiring density.

Further, the invention of the present application aims to propose the form of supply of components of a radio transmitting/receiving device, wherein even a user having the know how to design a high-frequency circuit is able to easily configure the corresponding radio transmitting/receiving device.

DISCLOSURE OF THE INVENTION

The invention of the present application proposes a method of mounting main functions for radio transmission and-reception on a plurality of modules with interposers each having a terminal pitch converting function as wiring boards and thereby configuring a radio transmitting/receiving device.

The known LSI, which has already been brought into integration, is mounted to each of three or four types of modules proposed by the invention of the present application. In the wiring board (interposer substrate) of each module, the pitch between terminals of semiconductor parts mounted on a main surface thereof is extended to the pitch between external terminals on the back thereof and thereby pitch-converted. The pitch between connecting terminals (pads or lands) on the main surface side of the wiring board (interposer substrate), and wiring densities correspond to a CSP and a flip chip. Owing to a wiring layer having a multilayer structure of each interposer substrate, internal wirings lying between the respective semiconductor parts in each module, and connecting terminals on the main surface side are connected to external terminals on the back side. The pitch between the external terminals on the back of each of the plurality of types of modules is set to equal to or greater than a minimum value (unified minimum terminal pitch Pu) set according to a predetermined rule. Parts each having a terminal pitch smaller than the minimum value set according to the predetermined rule are mounted onto any of the plurality of types of modules to carry out terminal pitch conversion. Parts each having a terminal pitch larger than the minimum value set according to the predetermined rule may or may not be mounted onto any of the plurality of modules, or may be directly mounted on a motherboard.

A method of distributing functions of a radio transmitting/receiving device to the plurality of types of modules is as follows: They are largely divided into a first module equipped with a function for amplifying a received radio frequency signal, demodulating the amplified radio frequency signal to a baseband signal and outputting the same, and a function for modulating the input baseband signal, converting the baseband signal to a radio frequency and outputting the same, a second module equipped with a function for amplifying an input radio frequency to output power (antenna output value), and a third module equipped with a function for controlling respective units according to a baseband signal process and a transmission/reception sequence based on a communication protocol. However, memories mounted on the third module might be mounted in parts to a fourth module in consideration of general versatility of the third module.

BEST MODE FOR CARRYING OUT THE INVENTION

Embodiment 1

Figure 2:
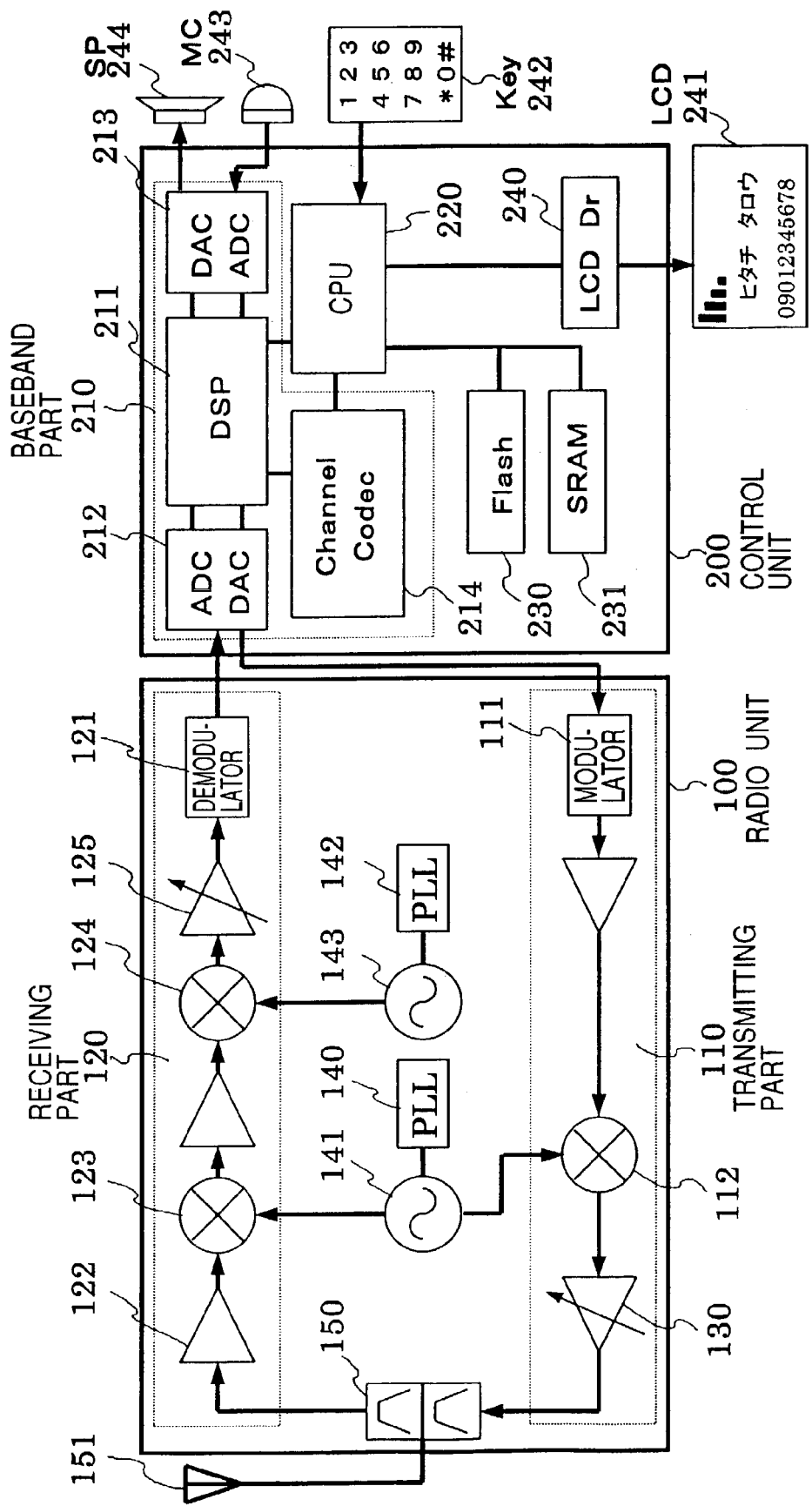
FIG. 2 is a diagram illustrating an example of a principal configuration of a digital cellular phone.

A plurality of types of modules constituting a radio transmitting/receiving device disclosed in the invention of the present application will hereinafter be described. A typical example in which a radio transmitting/receiving device for which the invention of the present application is intended, is built, is a digital cellular phone. The present embodiment will be described with the configuration of the digital cellular phone as an illustrative example. Elements constituting the digital cellular phone are largely divided into a radio unit 100 and a control unit 200 as shown in FIG. 2. The radio unit 100 is a unit which principally comprises analog circuits and performs transmission/reception of radios signals. The control unit 200 is a unit which handles a baseband signal and principally performs digital signal processing. An ADC and DAC 212 is provided at the boundary between the two and serves as a boundary for module separation.

The radio unit 100 comprises (1) a receiving part 120 having the function of amplifying a received radio frequency signal and demodulating it, (2) a transmitting part 110 which modulates a baseband signal and converts the same into a radio frequency, and amplifies it to transmission power (antenna output value), (3) a frequency synthesizer part 140 and 141 which generates a number of frequencies by their switching to effectively share frequency channels assigned to a system, (4) a frequency synthesizer part 142 and 143 which generates a second intermediate frequency, (5) an antenna sharing switch 150 provided with a filter and a switch selecting function to share a single antenna between transmission and reception, in such a manner that transmission power is radiated from the antenna without interfering with reception performance, and (6) the antenna 151. The transmitting part 110 in the radio unit 100 comprises a modulator 111 which modulates the baseband signal, a mixer 112 which converts a modulator output to a radio frequency, and an output power amplifier 130 which amplifies the radio frequency to its corresponding transmission power (antenna output value).

Power consumed by the output power amplifier 130 occupies a large position in power consumption of the cellular phone. While the function of controlling a transmission output is used to enhance the efficiency of the output power amplifier 130 and reduce its power consumption, very great power such as 3W or 4W occurs although produced in a moment of time, for example, and hence a substrate is brought to a high temperature. The substrate reaches a temperature of about 130° C., for example. The principal circuits of the radio unit 100 other than the output power amplifier treat with a small signal, and hence the high temperature of 130° C. even for a moment exceeds a limit. Therefore, the output power amplifier 130 is suitable for being mounted on a module different from other respective circuits of the radio unit 100.

(I) RF Signal Processing Unit Module 300

Figure 19:
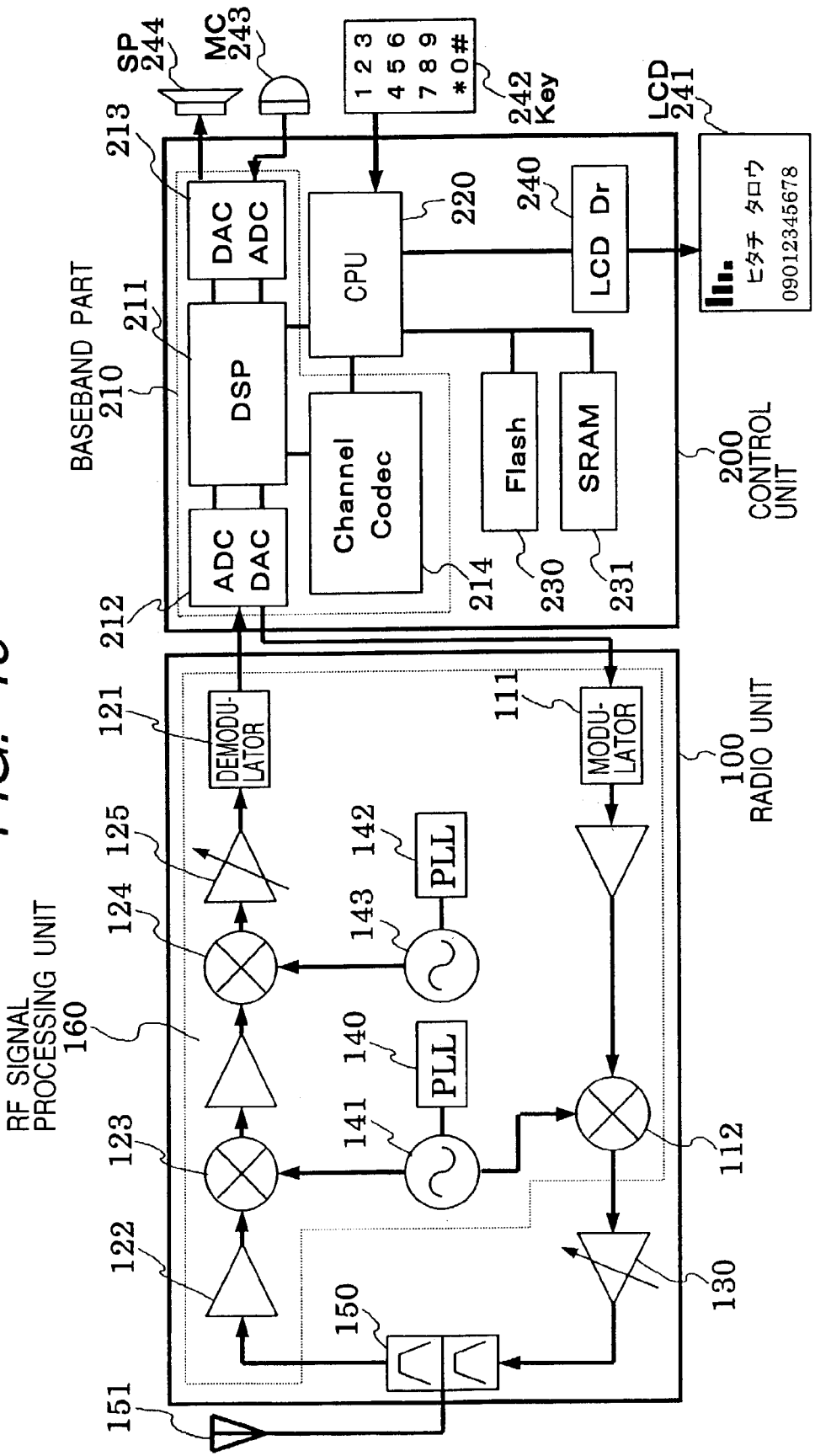
FIG. 19 is a diagram illustrating a configuration of a RF signal processing unit module of the radio transmitting/receiving device.

An example in which a principal circuit of the radio unit 100 excluding the output power amplifier 130, the antenna sharing switch 150 and the antenna 151 is partitioned from an RF signal processing unit module 160, is shown in FIG. 19. The RF signal processing unit module 160 is progressing in integration and adopts a 0.35 µm Bi-CMOS process. A large number of active elements used in a high frequency circuit are realized on the same chip.

Figure 12:
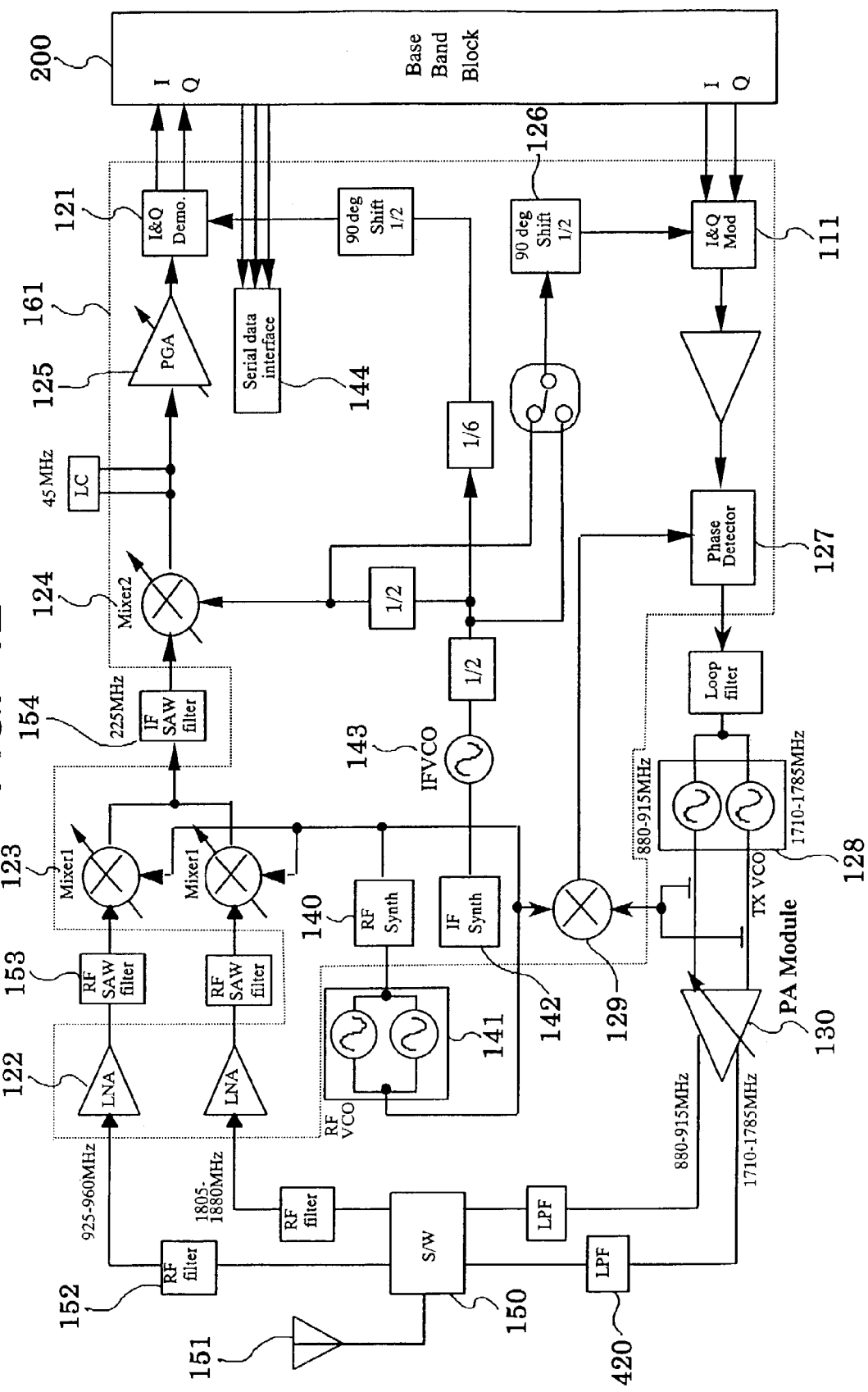
FIG. 12 is a diagram depicting an example of a configuration of an RF signal processing LSI.

An RF signal processing LSI 161 indicated by an area changed in background color in FIG. 12 is an example which has adopted a dual band system capable of simultaneously handling a communication system GSM (Global Systems for Mobile Communications) (900 MHz band) in which the Standard has been established with Europe as the center, and even a DCS1800 (Digital Cellular System at 1800 MHz)(1.8 GHz band). A reception system prepares first Mixers 123 to two systems every frequency bands with respect to the two frequency bands and is configured so as to convert the corresponding frequency to a common intermediate frequency 225 MHz. Thus, a second Mixer 124 and the later are common in configuration to a single band system. A radio frequency signal received by an antenna 151 is amplified by its corresponding high frequency amplifier (LNA) 122, whose output is mixed with a local oscillation signal by the first Mixer 123, followed by conversion to an IF frequency. An IFSAW filter 154 removes an unnecessary frequency from the output of the first Mixer 123, and the second Mixer 124 effects its frequency conversion. An intermediate frequency amplifier (PGA) 125 detects the intensity of a received signal and amplifies the received signal and thereafter a demodulator 121 demodulates the amplified received signal to a baseband signal.

An offset PLL (Phase-Locked Loop) system is adopted for transmission frequency conversion of a transmission system. A mixer (offset mixer) 129 is disposed i-n a feedback path extending from a VCO output 128 to a phase detector 127, whereby the frequency conversion is performed. The offset PLL system is different from a PLL for a frequency synthesizer in that frequency modulation of a reference signal for the offset PLL is reproduced at an output without scaling. With a view toward allowing the common phase detector 127 to cope with a dual band, the LSI 161 described in FIG. 12 has such a configuration as to simultaneously switch band selection and an output current value of the phase detector in such a manner that a loop band of the offset PLL becomes constant. Thus, the band of a loop filter is held constant while the filter is being used in common.

Figure 9:
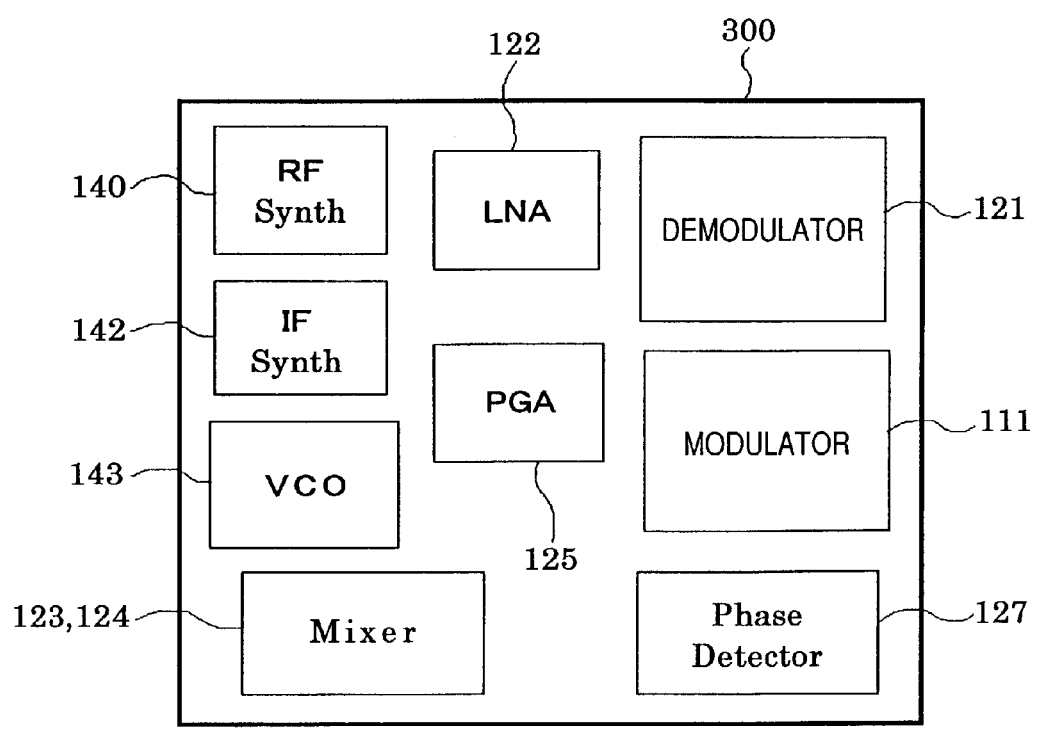
FIG. 9 is a diagram showing an example illustrative of functions mounted to an RF signal processing unit module.
Figure 13:
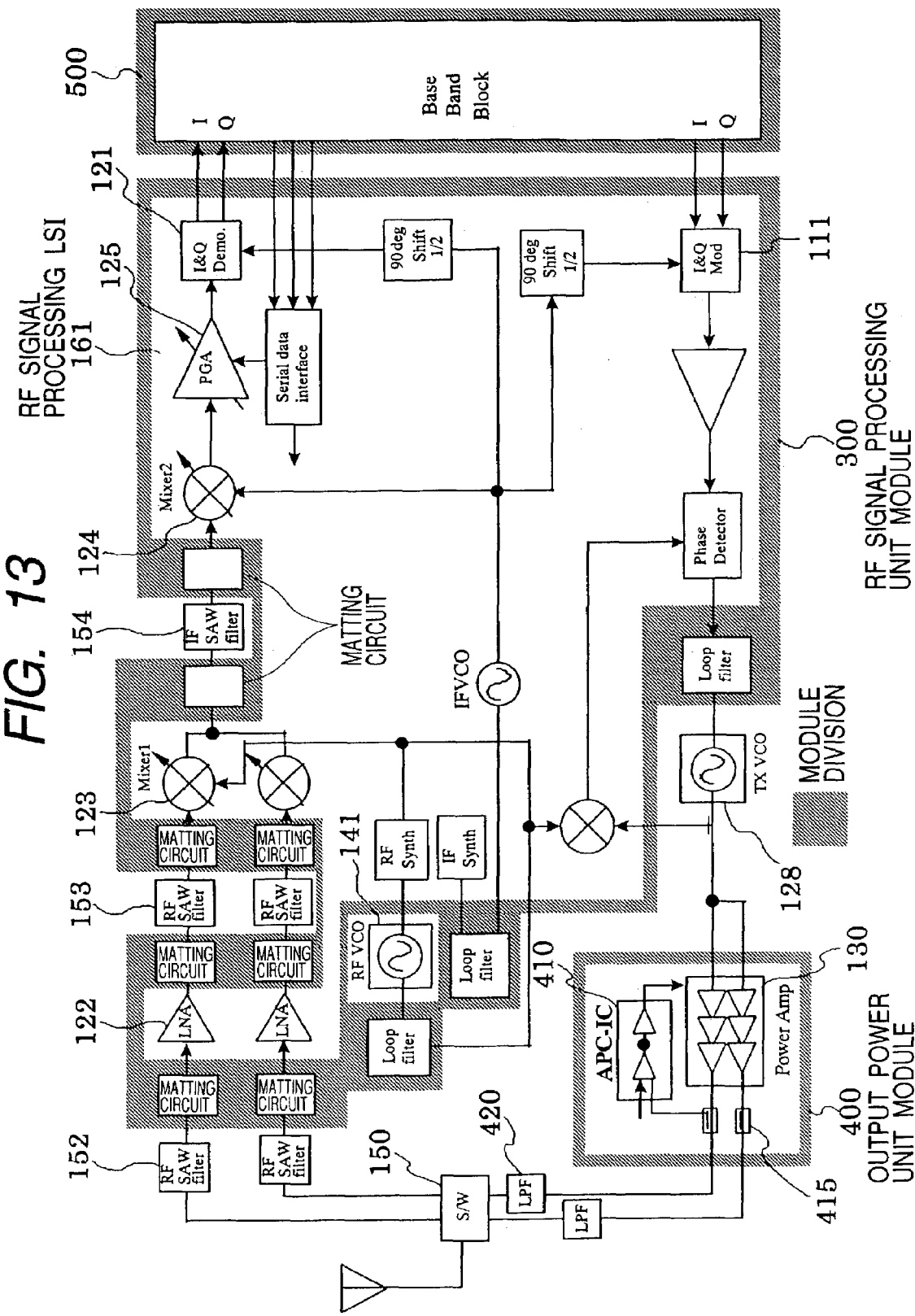
FIG. 13 is a diagram showing a module division example of a radio transmitting/receiving function.

An example of division of the module (RF signal processing unit module 300) mounted on one interposer substrate with the RF signal processing LSI 161 as the center and with integrated peripheral elements of the RF signal processing LSI 161 is shown in FIG. 13. An area indicated by a light background color indicates the RF signal processing LSI 161, whereas areas surrounded with deep background colors indicate circuits placed on the RF signal processing unit module 300. Whether or not RF SAW filters 152 and 153, an IF SAW filter 154, a TX VCO 128, an RF VCO 141, etc. should be mounted on the RF signal processing unit module 300, is based on the following judgement. If the respective parts meet predetermined performance even if they are integrated into the RF signal processing LSI 161, then they are brought into integration and mounted to the RF signal processing unit module 300. If they do not meet the predetermined performance and are not brought into integration and they are often subjected to changes in specifications or the like, then general versatility and commonality of the module are impaired, for example. It is therefore desirable that they are not mounted to the interposer substrate. It is considered that whether they are mounted thereto, is suitably changed. FIG. 9 shows one example of a function for mounting the respective parts on the RF signal processing unit module 300.

Figure 3:
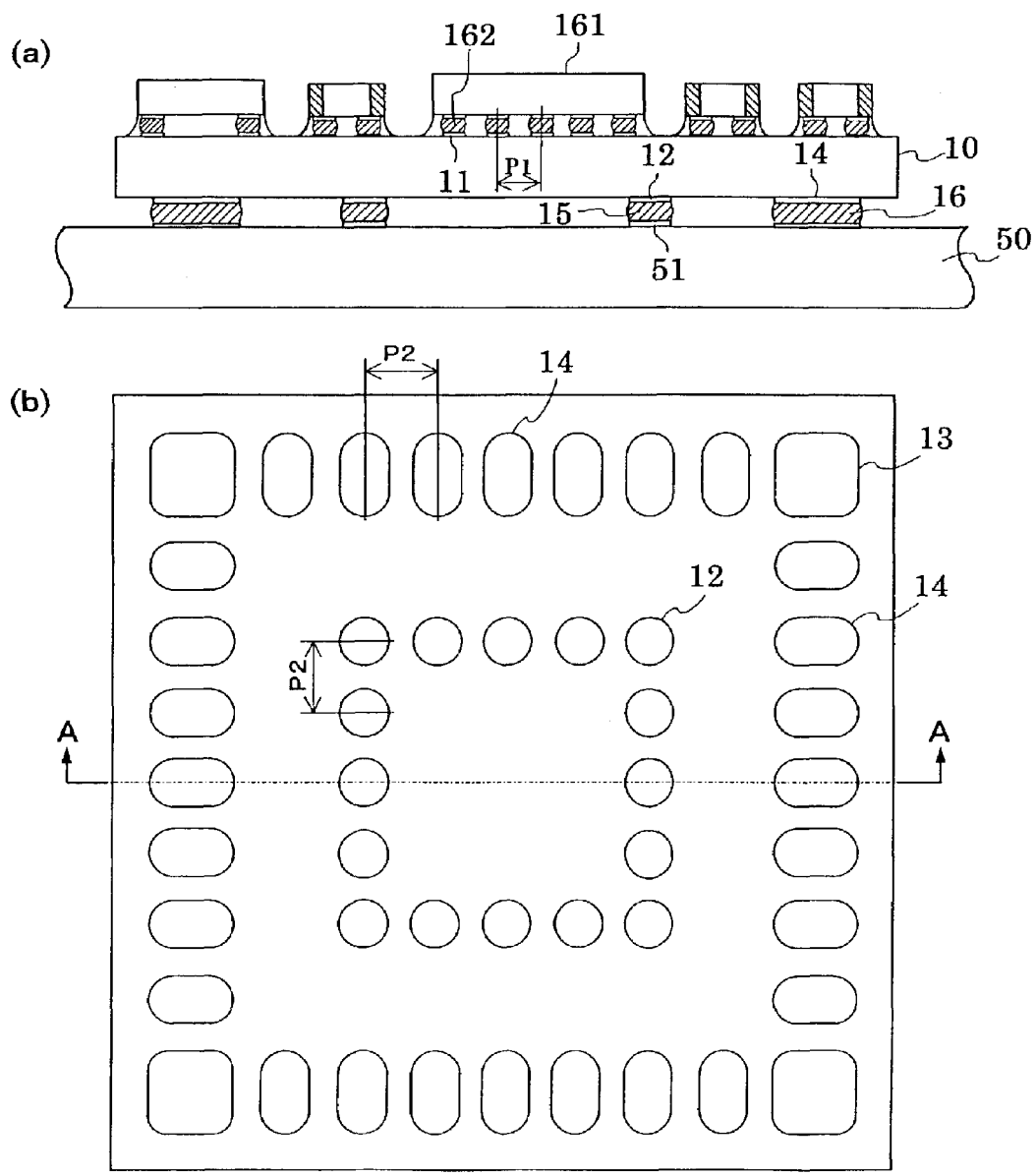
FIGS. 3(a)–(b) are diagrams depicting a typical cross-section of an interposer substrate of an RF signal processing unit module.

An interposer substrate 10 of the RF signal processing unit module 300 will be explained. FIG. 3(a) shows a typical cross-sectional view of the interposer substrate 10 mounted on a motherboard 50. Parts mounted on the main surface side of the interposer substrate 10 are not ones that indicate specific cross sections but ones that typically show the state of mounting thereof. FIG. 3 shows, as a main purport, the shapes and layout of external terminals on the back of the interposer substrate 10. Therefore, external terminals 12 and 14 and bump electrodes 15 and 16 on the back of the interposer substrate 10 of FIG. 3(a) are shown in association with a cross section A—A of FIG. 3(b).

Connecting terminals (equivalent to external terminals, pads or lands) 11 and 12 are formed on the main surface and back of the interposer substrate 10. The connecting terminals 11 and 12 form some of wirings of the interposer substrate 10. FIG. 3(b) shows the layout of the external terminals 12, 13 and 14 on the back of the interposer substrate 10. Solder portions of bump electrodes 162 of the RF signal processing LSI 161 are bonded to their corresponding connecting terminals (pads) 11 on the main surface in a state in which they are in direct contact with one another. Solder portions of bump electrodes 51 with the motherboard 50 are bonded to their corresponding external terminals 12 on the back of the interposer substrate 10.

Of the external terminals 12, 13 and 14 on the back thereof shown in FIG. 3(b), each of plane shapes of the external terminals 13 located at the corners is formed as, for example, a substantially square whose corners are chamfered round. A plane shape of each external terminal 14 disposed along the side of the interposer substrate 10 is formed in such a manner that the dimension thereof extending in the direction to intersect the side of the interposer substrate 10 becomes longer than the dimension thereof in the direction extending along the side thereof. It is shaped in the form of, for example, a substantially rectangle whose corners are chamfered round. Plane shapes of the external terminals 12 arranged in a rectangular form on the inner side of the back of the interposer substrate 10 are respectively configured in a circular form, for example. Solders 15 and 16 of bump electrodes are respectively shaped in substantially the same form in association with the external terminals 12, 13 and 14 on the back of the interposer substrate 10.

Of the bump electrodes 15 and 16 of the interposer substrate 10, the bump electrodes 16a and 16b (external terminals 13 and 14) on the outer peripheral side serve as electrodes for high-frequency analog signals, for example. Namely, since problems such as a propagation delay in signal, crosstalk noise, etc. arise when an inductance component of a path for each wire for transmitting a high-frequency signal is high, it is advisable to shorten a wiring distance between the RF signal processing LSI 161 and each of other elements (e.g. a resistor, a capacitor and other semiconductor device) for the purpose of a reduction in its inductance component. Encapsulating these wires in their corresponding internal wirings in the interposer substrate 10 is therefore effective in terms of high-frequency characteristics. Since the bump electrodes 16a and 16b (external terminals 13 and 14) on the outer peripheral side of the interposer substrate 10 are of microstrips, they are apt to make impedance matching. Accordingly, the bump electrodes for the high-frequency signals, of the interposer substrate 10 may preferably be disposed on the outer peripheral side as many as possible. The bump electrodes 15 (external terminals 12) disposed on the inner side of the interposer substrate 10 are respectively used as an electrode for a relatively high-potential power supply, an electrode for a relatively low-potential power supply and an electrode for a control signal, etc.

Plane dimensions of the external terminals 14 (bump electrodes 16) disposed on the outer peripheral side of the interposer substrate 10 are set in such a manner that a plane dimension of each external terminal in the direction (direction in which the side of the interposer substrate 10 intersects the direction in which the external terminals 14 adjoin each other: longitudinal direction) to intersect the side of the interposer substrate 10 becomes larger than a plane dimension thereof in the direction (direction in which the external terminals 14 are adjacent to one another: transverse direction) to be parallel to the side of the interposer substrate 10. Thus, contact areas of the respective external terminals 14 (bump electrodes 16) are increased without increasing adjacent intervals defined between the respective external terminals 14 (bump electrodes 16) whereby the strength of bonding is enhanced. The external terminals 13 (bump electrodes 17) disposed in the neighborhood of the corners on the outer peripheral side of the interposer substrate 10 are larger than other external terminals 14 (bump electrodes 16) and identical in length-to-width dimensional ratio. This is because even if done in this way, an increase in the adjacent intervals defined between the external terminals (bump electrodes) is not incurred and the distance from the center of the interposer substrate 10 is located at a farthest position, and the contact areas is preferably increased to improve the bonding strength of each bump electrode 17. The bump electrodes 17 principally aim to enhance the strength of bonding of the interposer substrate 10 to the motherboard (wiring board) 50. They may be formed as dummy electrodes which electrically disconnect the circuits on the interposer substrate 10 and the motherboard (wiring board) 50 from each other.

Figure 20:
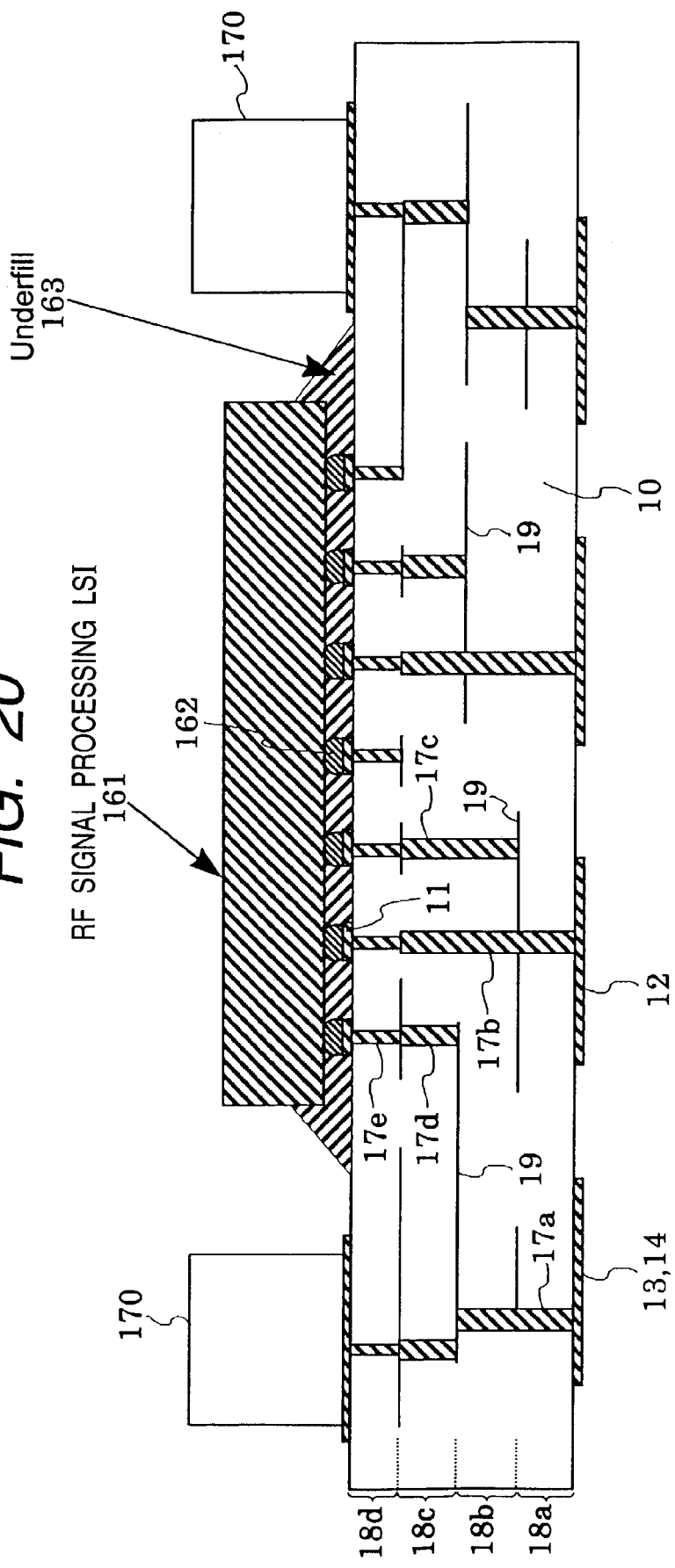
FIG. 20 is a diagram showing a fragmentary cross-section of an interposer substrate of an RF signal processing unit module.

FIG. 20 shows a fragmentary cross-sectional view of the interposer substrate 10. The interposer substrate 10 has a five-layer wiring structure, for example. However, the interposer substrate is not limited to the five-layer wiring layer, and changes can be made thereto in various ways. The interposer substrate 10 is formed by laminating insulating layers 18a through 18d like, for example, ceramic, glass ceramic or the like on one another. A dielectric constant or the like is changed by mixing BaO, $Al_2O_3$, $SiO_2$ or $CrZrO_3$ or the like into the ceramic, glass ceramic or the like.

A plurality of the connecting terminals (external terminals, pads or lands) 11, 12, 13 and 14 are formed on the main surface and back of the interposer substrate 10 as described above. Internal wirings 19 are formed inside the interposer substrate 10 and among the insulating layers 18a through 18d. Further, vias (connecting portions) 17a through 17e are respectively defined in the in the insulating layers 18a through 18d. The vias (connecting portions) 17a through 17e are wiring members for electrically connecting between different layer wirings and are formed by embedding a conductor film into holes defined in the insulating layers 18a through 18d.

As a main material for the connecting terminals 11, 12, 13 and 14, internal wirings 19 and vias 17a through 17e of the interposer substrate 10, for example, a high melting-point metal like tungsten or the like may be used. In the connecting terminals 11, 12, 13 and 14, the surfaces thereof utilizing the tungsten used as the main material are given plating of nickel and gold or the like, for example.

The RF signal processing LSI 161 is mounted on the main surface of the interposer substrate 10 in a state in which the main surface thereof is made opposite to the interposer substrate 10, and with the bump electrodes 162 interposed therebetween. The bump electrodes 162 is made up of an alloy of lead and tin or gold having a height of about 0.05 mm, for example. The circuits of the RF signal processing LSI and the wirings of the interposer substrate 10 are electrically connected to one another through the bump electrodes 162. An under fill 163 formed of, for example, an epoxy resin or the like is charged between the opposite surfaces of the RF signal processing LSI and the interposer substrate 10, whereby the main surface (and parts of the sides) of the RF signal processing LSI 161 are sealed therewith. Reference numerals 170 indicate other mounting parts, which include, for example, Capacitors, Resistors, Inductors, Diodes, Transistors, etc.

In the interposer substrate 10 as shown in FIG. 3, a layout interval (pitch) P1 between the adjacent bump electrodes 162 of the RF signal processing LSI 161, and a layout interval (pitch) P2 between the adjacent connecting terminals (pads or lands) 51 of the motherboard (wiring board) 50 are pitch-converted so that the circuits of the RF signal processing LSI 161 and the wirings of the motherboard (wiring board) 50 are electrically connected. A minimum terminal pitch P1 of the above LSI is 0.15 mm, for example, and a minimum terminal pitch P2 between the bump electrodes 15 of the interposer substrate 10 is 0.8 mm, for example. In the parts other than the RF signal processing LSI 161, mounted on the interposer substrate 10, their minimum terminal pitches are estimated to be equal to the above P1 or greater than the same. The minimum terminal pitch P2 between the external terminals of the interposer substrate 10 is determined according to a predetermined rule. The predetermined rule is to match the minimum terminal pitches between adjacent external terminals of respective interposer substrates used in a plurality of types of modules proposed by the present invention with a unified minimum terminal pitch Pu or set the same to the minimum terminal pitch Pu or more. If the minimum terminal pitch between arbitrary parts constituting a radio transmitting/receiving device for which the invention of the present application is intended, is smaller than the unified minimum terminal pitch Pu, then the parts are mounted on any of the interposer substrates of the plurality of types of modules. By using the plurality of types of modules that comply with the above predetermined rule, a user prepares a motherboard which satisfies the unified minimum terminal pitch Pu, and disposes and mounts the plurality of types of modules and other parts not mounted on the plurality of types of modules on the motherboard, thereby making it possible to configure the corresponding radio transmitting/receiving device.

By selecting, as a process for manufacturing the adopted motherboard (wiring board), either the conventional press lamination multilayer wiring process, a build-up multilayer wiring process for alternately forming an insulating layer including-vias and a conductor layer to provide a multilayered form, or a new press lamination multilayer wiring process or the like for charging conductive paste into a resin insulating plate with holes defined therein and repeatedly bringing a core substrate formed with patterns into multilayer form, the minimum terminal pitch (minimum terminal pitch) allowed by its manufacturing process is selected. If the conventional press lamination multilayer wiring process is taken, then the minimum terminal pitch is about 0.7 mm.

Further, the interposer substrate 10 has even the function of relaxing distortion developed due to mismatching between thermal expansion coefficients of a Si chip for the RF signal processing LSI 161 and the motherboard (wiring board) 50.

(II) Output Power Unit Module 400

In the radio unit 100 corresponding to the principal component of the digital cellular phone shown in FIG. 2, the output power amplifier 130 consumes large power even in a moment of time and reaches a high temperature. Therefore, the output power amplifier 130 is not mounted on the same module as the RF signal processing unit module 160.

While a GaAs MESFET (metal semiconductor FET) is mainstream as an active device for the output power amplifier 130, an Si bipolar transistor, a GaAs HBT (heterobipolar transistor), an Si MOSFET (Metal-Oxide-Semiconductor Field-Effect Transistor), etc. are also used. As the output power amplifier, a low-cost hybrid IC, a GaAs MESFET-based small-sized MMIC (monolithic microwave IC), etc. may be adopted.

Figure 21:
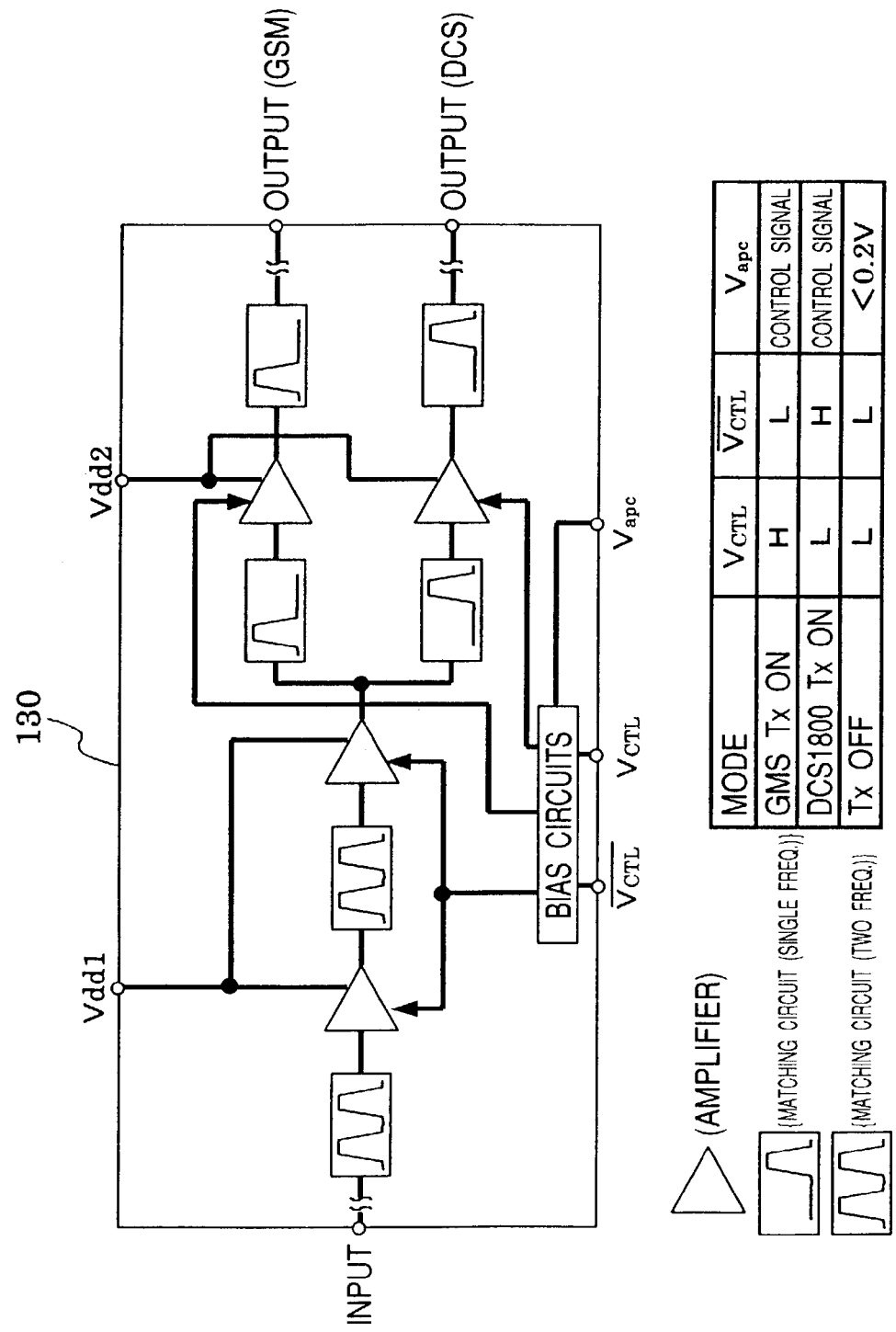
FIG. 21 is a diagram depicting a block diagram of a dual band power amplifier.

An output power amplifier 130 shown in FIG. 12 is an example of a power amplifier corresponding to a dual band. As shown in a block diagram in FIG. 21, the present output power amplifier 130 is an example in which first- and second-stage amplifying units of amplifying units of three stages share the use of the two bands without using two single-band power amplifiers corresponding to the two bands, and two final stages are adopted to optimize operation efficiency at the respective bands. MOSFETs 131 and 132 (FIG. 6) easy to control and excellent in thermal stability are adopted for amplifying devices. The selection of an operation mode is based on a band switch logic signal ($V_{CTL}$) supplied from outside.

An APC-IC (power controller) 410 shown in FIG. 13 is a circuit related to the control of the output power amplifier 130, which generates a control signal according to an output level to adjust bias conditions of the amplifying units of the respective stages, thereby reducing an unnecessary current and thereby enhancing power efficiency. The APC-IC 410 is suitable for being mounted onto the output power unit module 400 together with the output power amplifier 130. However, it is also considered that since the APC-IC 410 receives a control input from the control unit 200, the APC-IC 410 is packaged onto an RF signal processing unit module 300 provided with a serial data interface 144 which receives a control signal supplied from the control unit 200.

Figure 5:
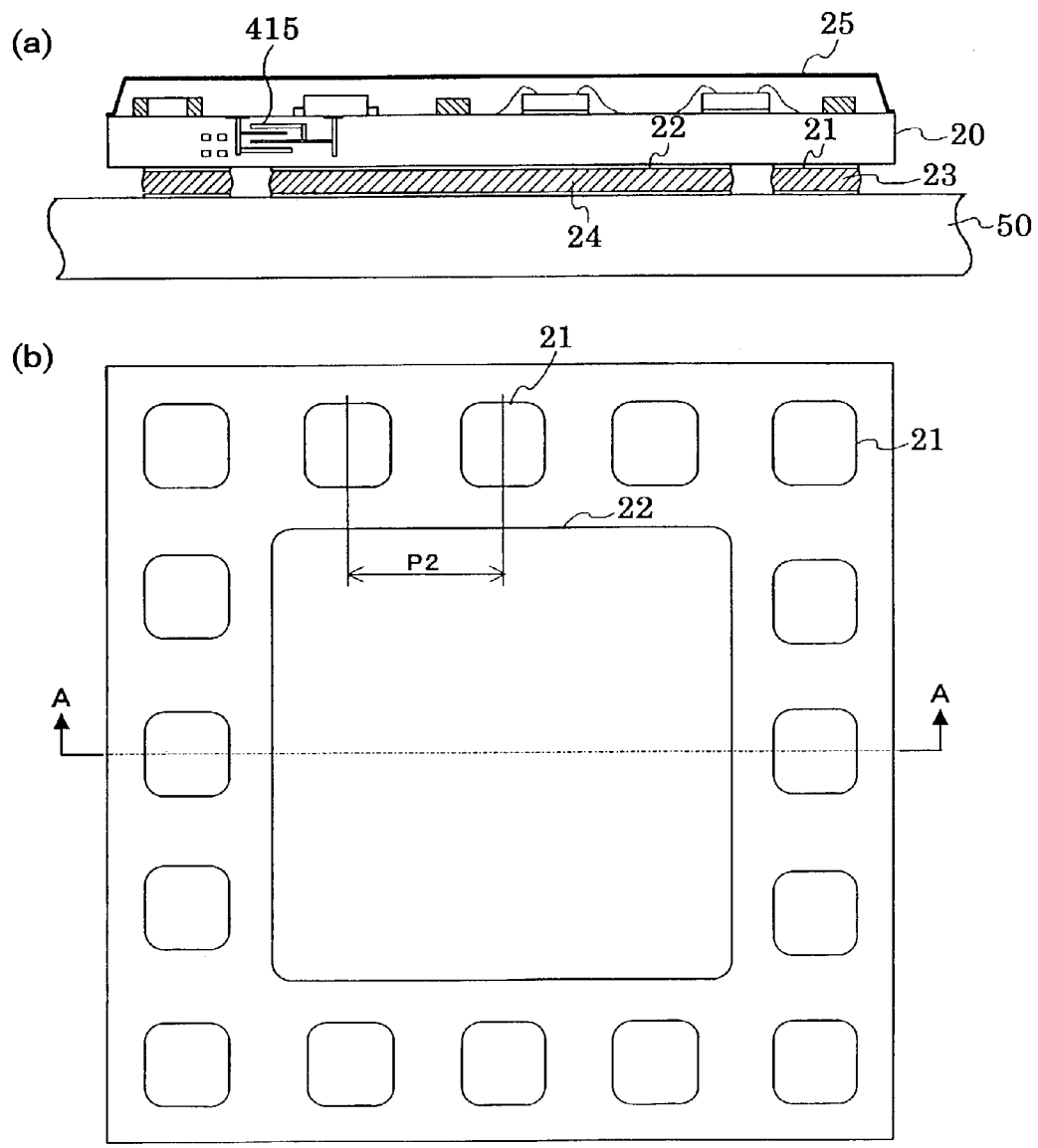
FIGS. 5(a)–(b) are diagrams illustrating a typical cross-section of an interposer substrate of an output power unit.

An interposer substrate 20 of the output power unit module 400 will be described. FIG. 5($a$) shows a typical cross-sectional view of the interposer substrate 20 mounted on a motherboard 50. Parts mounted on the main surface side of the interposer substrate 20 are not ones that indicate specific cross sections but ones that typically show the state of mounting thereof. An example is shown in which a coupler 415 is inner-packaged inside the interposer substrate 20 as will be described later.

FIG. 5 shows, as a main purport, the shapes and layout of external terminals (lands) on the back of the interposer substrate 20. Therefore, external terminals 21 and 22 and bump electrodes 23 and 24 on the back of the interposer substrate 20 of FIG. 5($a$) are shown in association with a cross section A—A of FIG. 5($b$).

The external terminals 21 and 22 are formed on the back of the interposer substrate 20 and form some of wires. FIG. 5($b$) shows the layout of the external terminals 21 and 22 on the back of the interposer substrate 20. A plane shape of the external terminal 21 is formed as, for example, a substantially square whose corners are chamfered round. The external terminals 21 are disposed in a line on the outer peripheral side as much as possible along the respective sides of the back of the interposer substrate 20. A plane profile of the external terminal 22 is shaped in the form of, for example, a substantially square whose corners are chamfered round. The external terminal 22 is disposed so as to occupy a large area in the central portion of the back of the interposer substrate 20. Further, solders 23 and 24 of bump electrodes are respectively shaped in substantially the same form in association with the external terminals 21 and 22.

The external terminals 21 (bump electrodes 23), which go around the outer peripheral side of the back of the interposer substrate 20, principally serve as terminals for high-frequency analog signals. The reason why they are disposed on the outer peripheral side as much as possible, is similar to the bump electrodes 16$a$ and 16$b$ of the interposer substrate 10 of the RF signal processing unit module 300. The external terminal 22 (bump electrode 24) is principally used as GND or the like and brings about a radiating effect owing to its broad area.

The interposer substrate 20 has a five-layer wiring structure formed by laminating insulating layers like, for example, ceramic, glass ceramic or the like on one another. However, the interposer substrate is not limited to the five-layer wiring layer, and various changes can be made thereto. A size reduction in the module (output power unit module 400) is realized by using conductors among these layers as strip lines. The interposer substrate 20 has satisfactory thermal conductivity owing to the use of materials such as ceramic, glass ceramic, etc.

Figure 6:
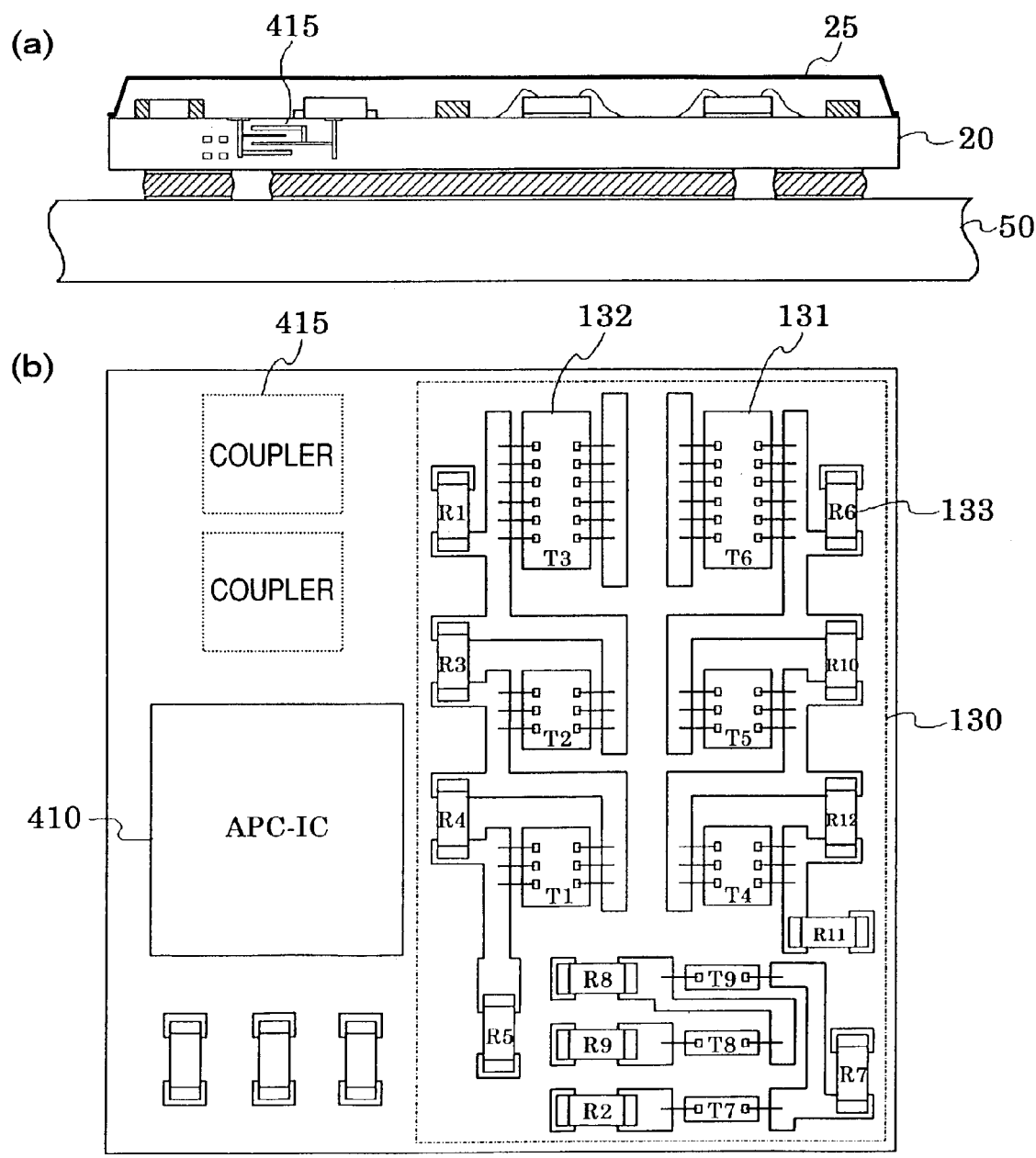
FIGS. 6(a)–(b) are diagrams depicting a typical layout drawing of parts mounted on the interposer substrate of the output power unit.

Consideration is given to the fabrication of passive elements such as capacitors, inductors, etc. in the interposer substrate 20. A sectional example in which couplers 415 each comprising, for example, a directional coupler for setting transmission or output power of the output power amplifier 130 to a predetermined power value, and a filter or the like are made up, is shown in FIG. 6(*a*). Building passive elements (parts) in the interposer substrate 20 makes it possible to make extensive use of a mounting surface (main surface) of the interposer substrate 20. As shown in FIG. 6(*a*), the design of a reduction in mounting area of the interposer substrate 20 can be executed by mounting other parts over the coupler.

An output power amplifier 130, an APC-IC 410 and couplers 415 are shown in FIG. 6(*b*) as examples of semiconductor parts mounted on the output power unit module 400. The main surface side of the output power unit module 400 is covered with a metal-made cap 25 which plays the role of an electromagnetic shield effect.

Figure 8:
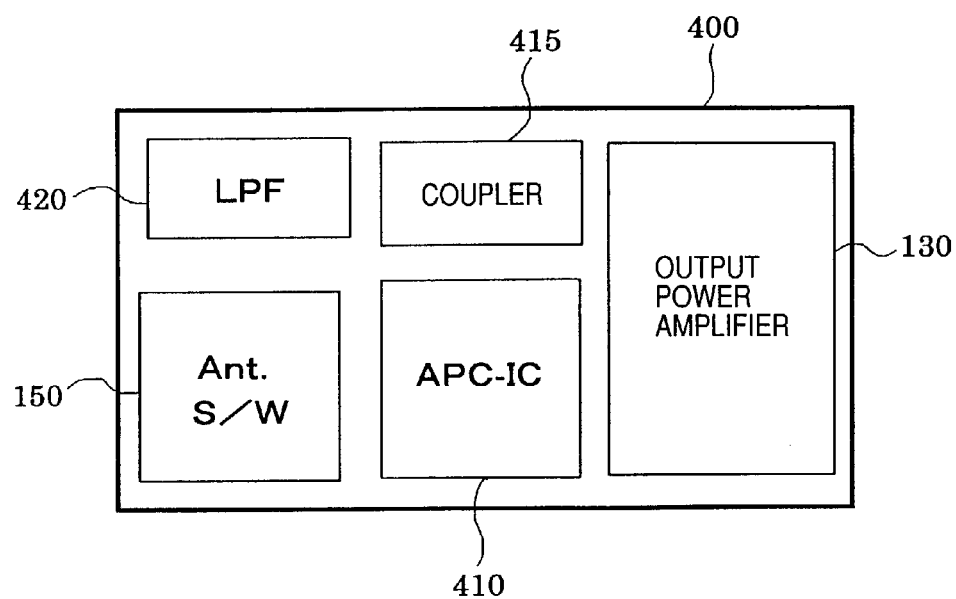
FIG. 8 is a diagram depicting an example illustrative of functions mounted to an output power unit module.

The semiconductor part essential for mounting to the output power unit module 400 is of the output power amplifier 130. Other parts are estimated to be mounted on the same module (output power unit module 400) from a combination high in general versatility. FIG. 8 illustrates an output power amplifier 130, an APC-IC 410, a coupler 415, an LPF 420, and an Ant.S/W 150 as an example of a combination of functions mounted to an output power unit module 400. Since the parts are used at an operation frequency band exceeding 1 GHz, part mutual wring paths are shortened within the interposer substrate 20 to reduce attenuation of a desired signal.

The present interposer substrate 20 is also provided with a pitch converting function. A minimum terminal pitch P1 between parts mounted to the main surface side is extended to a minimum terminal pitch P2 between external terminals of the interposer substrate 20 to thereby perform pitch conversion. An important point is that the minimum terminal pitch P2 between the external terminals is equivalent to the unified minimum terminal pitch Pu determined according to the predetermined rule or is a value greater than the minimum terminal pitch Pu. Owing to it, the output power unit module 400 can be packaged or mounted to its corresponding motherboard which satisfies the unified minimum terminal pitch Pu.

The reason why the RF signal processing unit module 300 of the invention of the present application and the output power unit module 400 both described above are separated from each other as discrete modules, is that the influence of heat generated in the output power amplifier 130 mounted on the output power unit module has been taken into consideration. Since, however, it is predicted that a reduction in power consumption of the output power unit module will make progress from now on, the two modules are considered to be integrated into one module.

(III) Memory/Logic Unit Module 500

Figure 18:
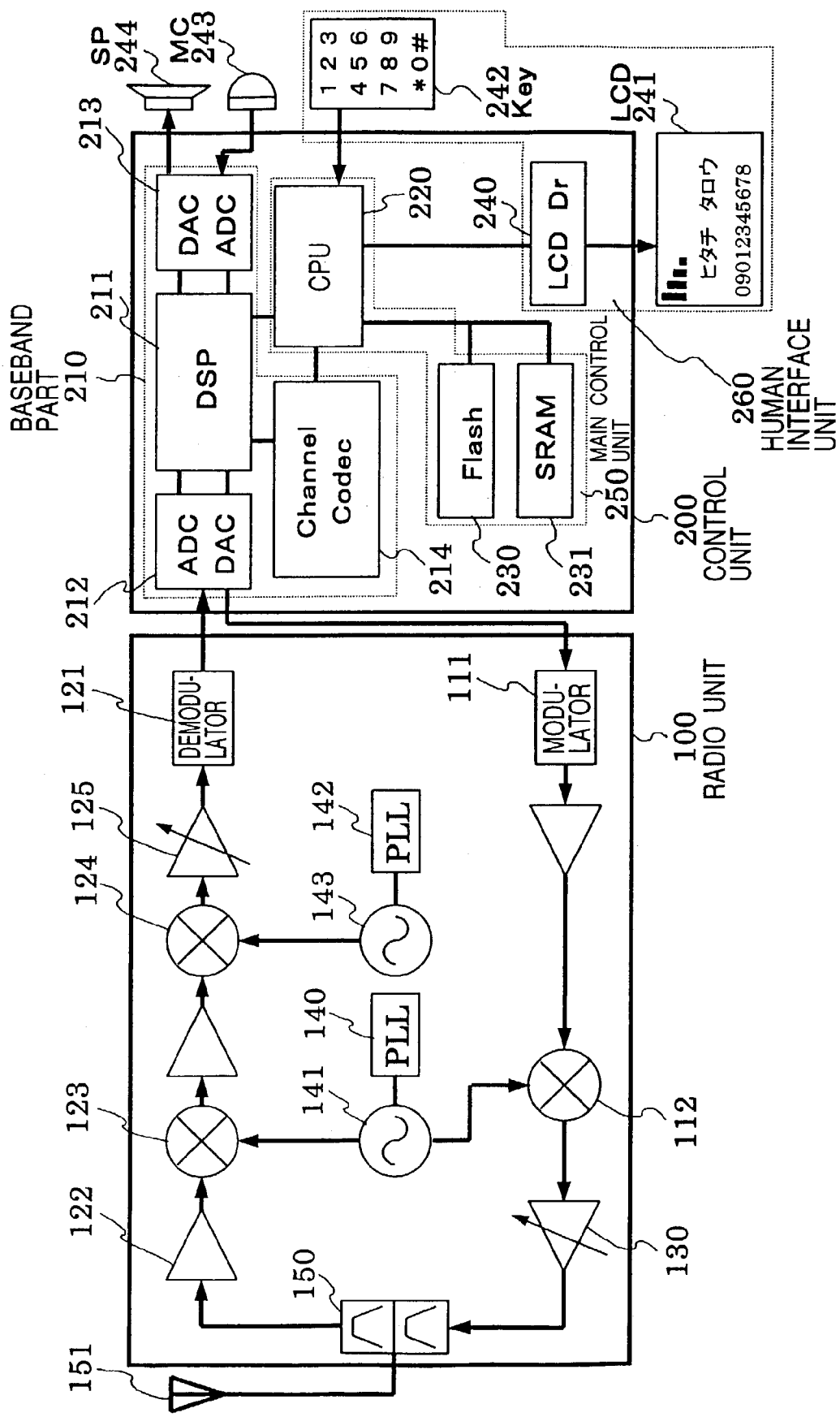
FIG. 18 is a diagram showing a configuration of a control unit of a transmitting/receiving device.

A control unit 200, which is of a main component of a digital cellular phone shown in FIG. 18, comprises (1) a baseband part 210, (2) a main control part 250 and (3) a human interface part 260.

The baseband part 210 further comprises the following components.

(1) An ADC 212 which inputs I and Q signals obtained by separating a received signal by a demodulator 121 of a radio unit 100 and converts the same into digital data, and a DAC 212 which converts transmitting digital data to the corresponding I and Q signals and outputs the same to a modulator 111 of the radio unit 100.

(2) A DSP (digital signal processor) 211 which performs a process for demodulating the received digital data distorted due to fading such as a multipass delay or the like and effecting an error-correcting and decoding process thereon to thereby take out encoded voice data alone, and further restoring the compressed/encoded voice data to the original linear PCM (pulse-code modulation) data, a process for voice-encoding a voice signal inputted from an MC 243, an error-correcting and encoding process, etc.

(3) A DAC 213 for converting the PCM data to an analog voice signal and outputting the same to an SP 244, and an ADC 213 for converting the voice signal inputted form the MC 243 to PCM data.

(4) A channel codec 214 which principally performs control on a TDMA (time division multiple access) corresponding to an access system for, where a plurality of users share the use of a radio transmission line and simultaneously perform communications, dividing the time required for each radio channel used by the users to make use of one radio frequency during one frame, into several time slots, and allowing the respective users to use the different times slots.

The main control part 250 comprises a combination of hard logic circuits such as a timer circuit, etc. with a microcomputer (CPU) 220 and its peripheral circuits as the center. The main control part 250 performs control on human interface relations such as control on respective portions of a telephone according to a transmission/reception sequence based on a protocol, a display therefor, key input control, etc. A flash memory 230 is used as an area for storing various programs executed in the CPU 220 or DSP 211 and data, and an SRAM 231 is principally used as a work area for a program executed by the CPU 220. Other memories, e.g., an SDRAM and the like might be mounted to the main control part. There may be cases in which the control CPU 220 is set up in plural form. Since the transmission/reception of each signal is intermittently performed in the TDMA digital system, a power supply for the radio unit is cut off where unnecessary to thereby reduce power consumption. On the other hand, a control unit circuit is also brought to a waiting state or rendered power-off when unnecessary in operation to thereby carry out a low power consumption operation.

The human interface part 260 is a part which performs an interface with a user. Instructions issued from the user are principally performed by a key switch 242. Further, the display is principally performed by an LCD displayer 241.

Since CMOS is very low in power consumption in a steady state and is suited for a low power consumption circuit, a digital control circuit part generally makes use of CMOS. A discussion about the integration of the control unit into one chip inclusive of the respective circuits of (1) the baseband part 210, (2) the main control part 250 and (3) the human interface part 260 has been put forward. There is actually known an example in which the microcomputer (CPU) 220, DSP 211 and Channel Codec 214, and the like are integrated into one chip. A MCM (multi-chip module) form is however considered to be effective due to the following reasons. The control unit 200 is considered to vary in specifications in various ways according to a functional expansion of a future personal digital assistance, a change in communication system, and user's various applications, etc. Integrating the control unit 200 into one chip is not suited to prompt coping with specification changes. If the TAT (Turnaround Time) for product development is emphasized, it is advantageous to make MCM form.

As to the form of mounting of the microcomputer (CPU) 220, DSP 211, memories 230 and 231, etc., which are used as the main semiconductor parts of the control unit 200, their mounting in a package form such as a CSP or the like or in a bear chip form such as a flip chip or the like is estimated to become main since a demand for a reduction in mounting area is high. Along with it, I/Os tend to increase in number with an increase in function, and are hence estimated to result in many terminals formed in full-face lattice form at narrow pitches. Correspondingly, there is a need to narrow a pitch between terminals on a main surface of a motherboard and enhance a wiring density. However, the technology of manufacturing a build-up substrate or the like under the present situation is not capable of increasing a wiring density and the number of wiring layers in a limited partial area of the motherboard. Therefore, the above-described semiconductor parts are mounted on an interposer provided with a terminal pitch converting function to configure the corresponding MCM (multi-chip module). The MCM is mounted onto the motherboard.

Figure 7:
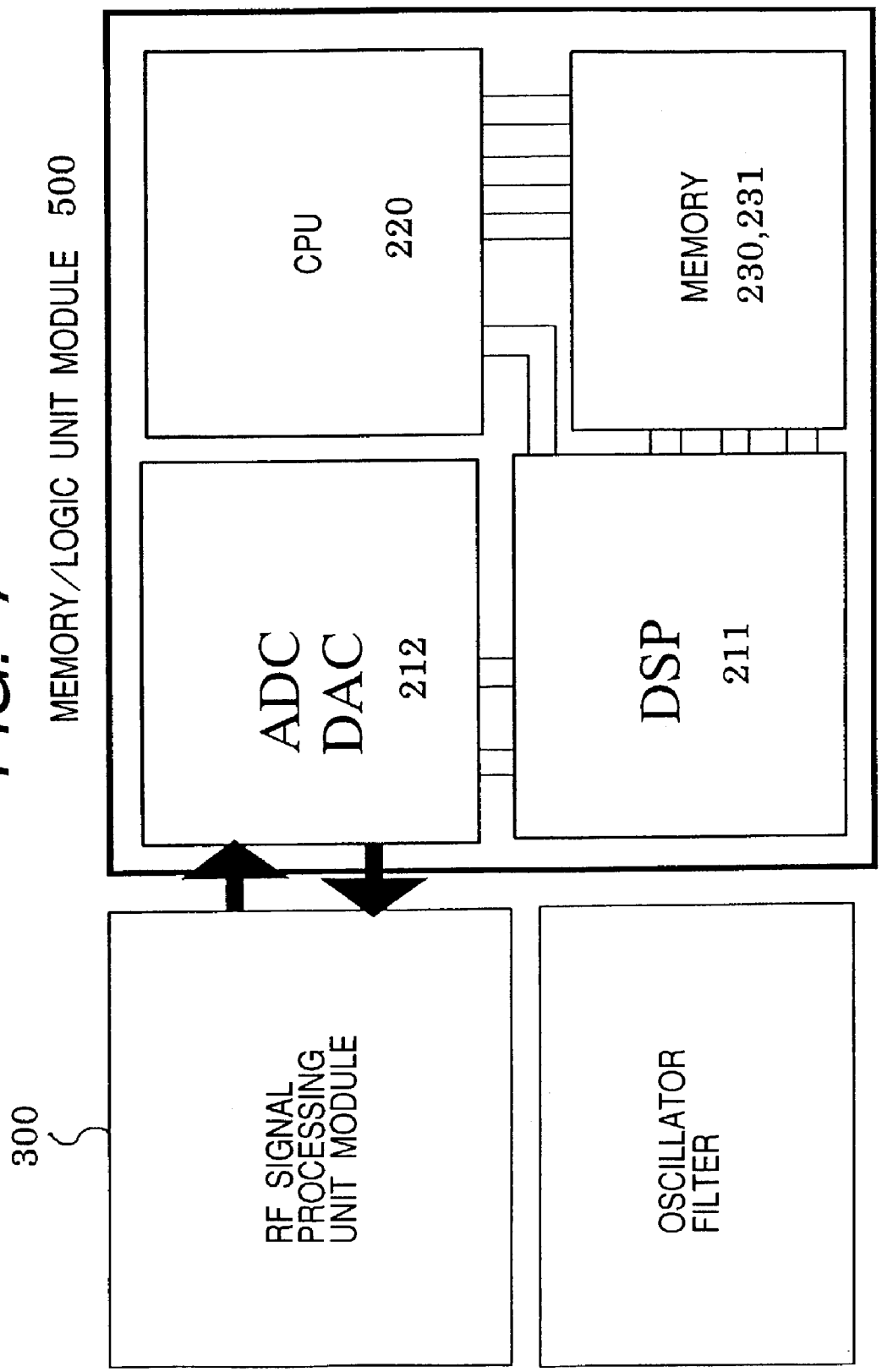
FIG. 7 is a diagram showing an example of a configuration of a memory/logic unit module.

As main semiconductor parts (functions) mounted to the memory/logic unit module 500, for example, a microcomputer (CPU) 220, a DSP 211, an ADC/DAC 212 and memories 230 and 231 as shown in FIG. 7 may be mentioned. The I and Q signals are inputted and outputted between the ADC/DAC 212 and its corresponding RF signal processing unit module 300 through the ADC/DAC 212. The above-described microcomputer (CPU) 220, DSP 211, etc. may be also regarded as functions mounted to an integrated LSI without being specified as discrete parts. An oscillator, a filter and the like are illustrated as examples mounted onto a motherboard 50.

Figure 4:
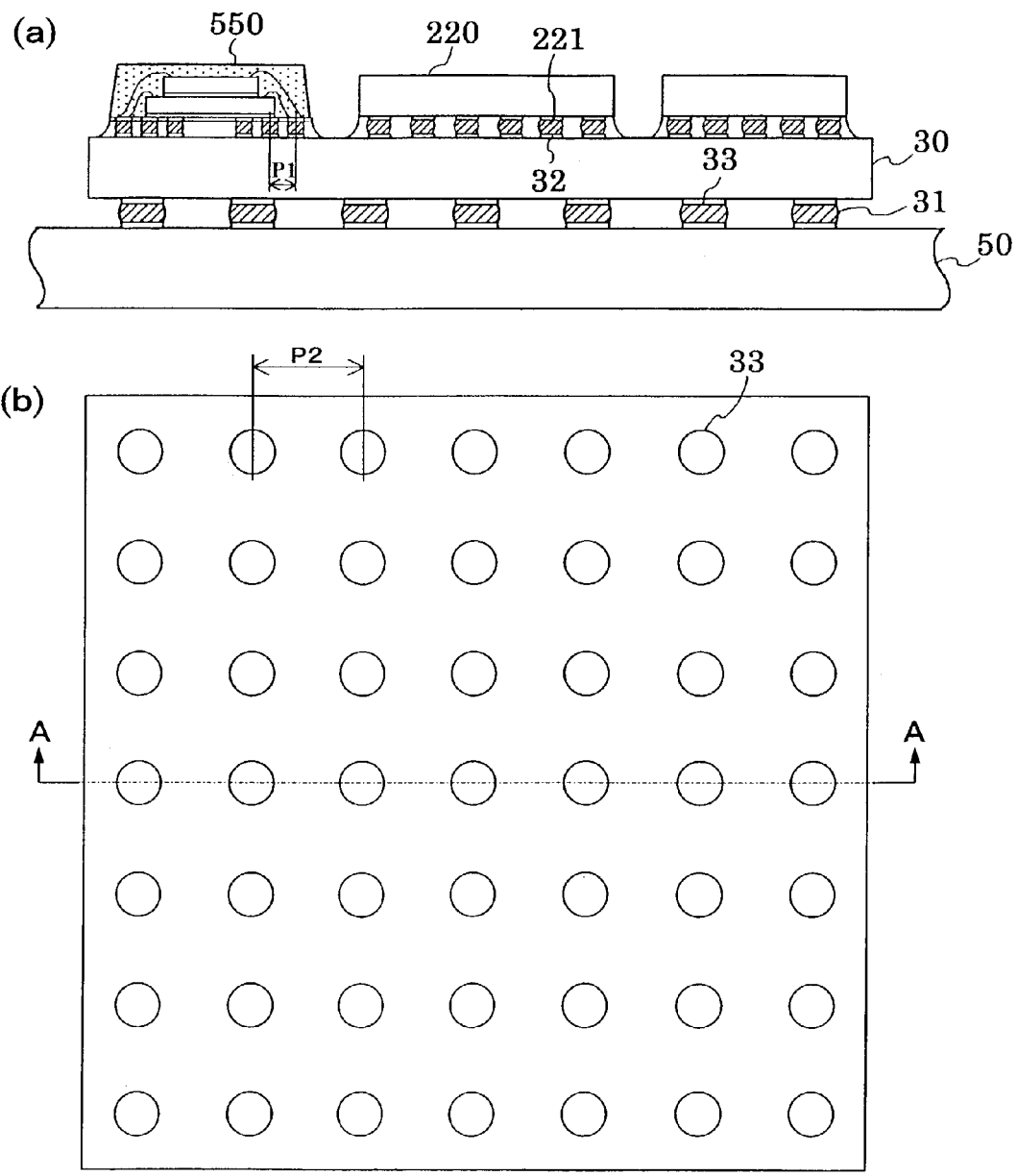
FIGS. 4(a)–(b) are diagrams showing a typical cross-section of an interposer substrate of a memory/logic unit.

A typical cross-sectional view of a memory/logic unit interposer is shown in FIG. 4(*a*). Respective parts mounted on the main surface side of an interposer substrate 30 are not ones that indicate specific cross sections but ones that typically show the state of mounting thereof. FIG. 4 shows, as a main purport, the shapes and layout of external terminals (pads or lands) on the back of the interposer substrate 30. Therefore, external terminals 33 and bump electrodes 31 on the back of the interposer substrate 30 of FIG. 4(*a*) are shown in association with a cross section A—A of FIG. 4(*b*).

When principal semiconductor parts of a control unit 200 are mounted on the interposer substrate 30, a mounting area and size of the interposer substrate 30 become relatively large. If the interposer substrate 30 and a motherboard 50 are different in the quality of material, then stress developed due to the difference between thermal expansion coefficients of the two is applied to ball portions of the bump electrodes 31 on the interposer substrate 30, for example, thus resulting in the occurrence of microcracks. Therefore, the interposer substrate 30 is made up of a material having a thermal expansion coefficient as close to the material of the motherboard 50 as possible to thereby reduce the difference between the thermal expansion coefficients and prevent the ball portions from being cracked. Since an organic material is generally used as the material for the motherboard 50, a glass epoxy substrate, a polyimide substrate or the like is considered as the material for the memory/logic unit interposer substrate 30. Owing to it, the reliability of mounting of the module can be enhanced.

The interposer substrate 30 is considered to take a multilayered wiring structure of five layers, for example. Connecting terminals 32 and 33 are formed on the main surface and back of the interposer substrate 30. The connecting terminals 32 and 33 form some of wirings for the interposer substrate 30. FIG. 4(*b*) shows an example in which the connecting terminals 33 on the back of the interposer substrate 30 are disposed in an area array form. For example, solder portions of bump electrodes 221 for a microcomputer (CPU) 220 are directly bonded to their corresponding connecting terminals 32 on the main surface of the interposer substrate 30. Solder portions of the bump electrodes 31 are directly bonded to their corresponding connecting terminals 33 (plural external terminals) on the back thereof. A minimum pitch between the adjacent connecting terminals 33 (bump electrodes 31) on the back of the interposer substrate 30 is about 0.8 mm in the present circumstances and expected to reach about 0.65 mm according to the estimate thereof in 2006. A minimum pitch (flip-chip device pitch) between the connecting terminals 32 (bump electrodes 221) on the main surface thereof is about 0.15 mm under the present situation and expected to reach about 0.1 mm according to the estimate thereof in 2006.

Figure 10:
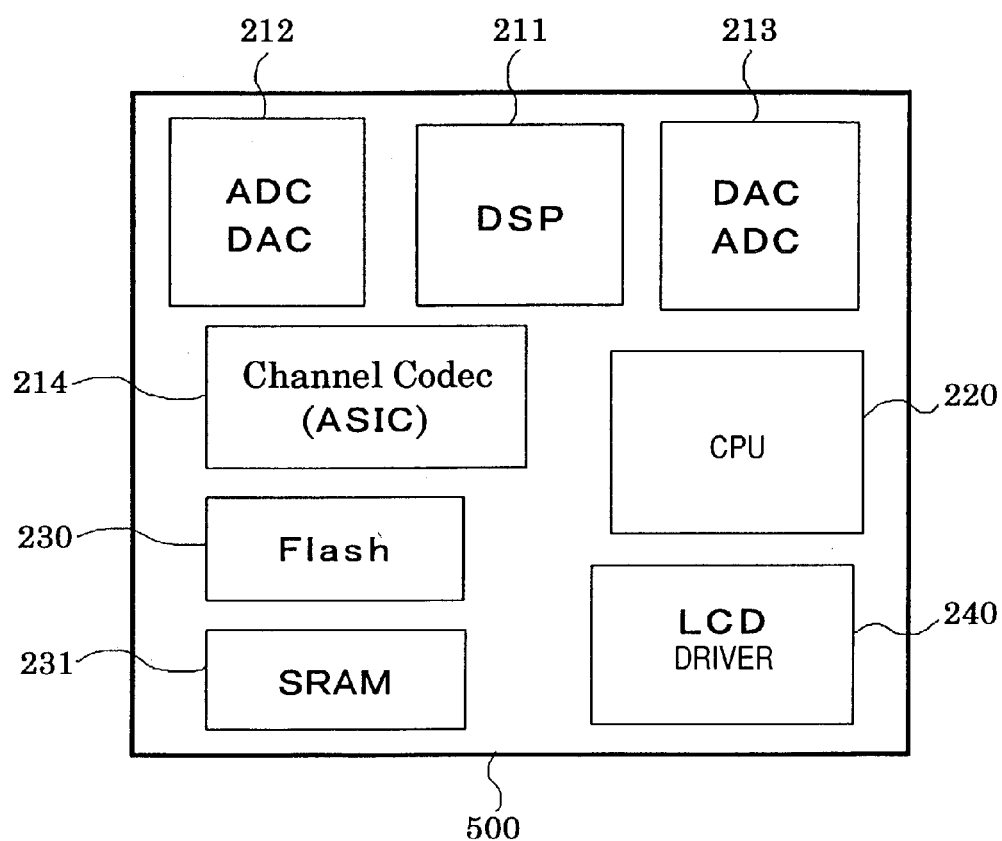
FIG. 10 is a diagram showing an example illustrative of functions mounted to the memory/logic unit module.
Figure 16:
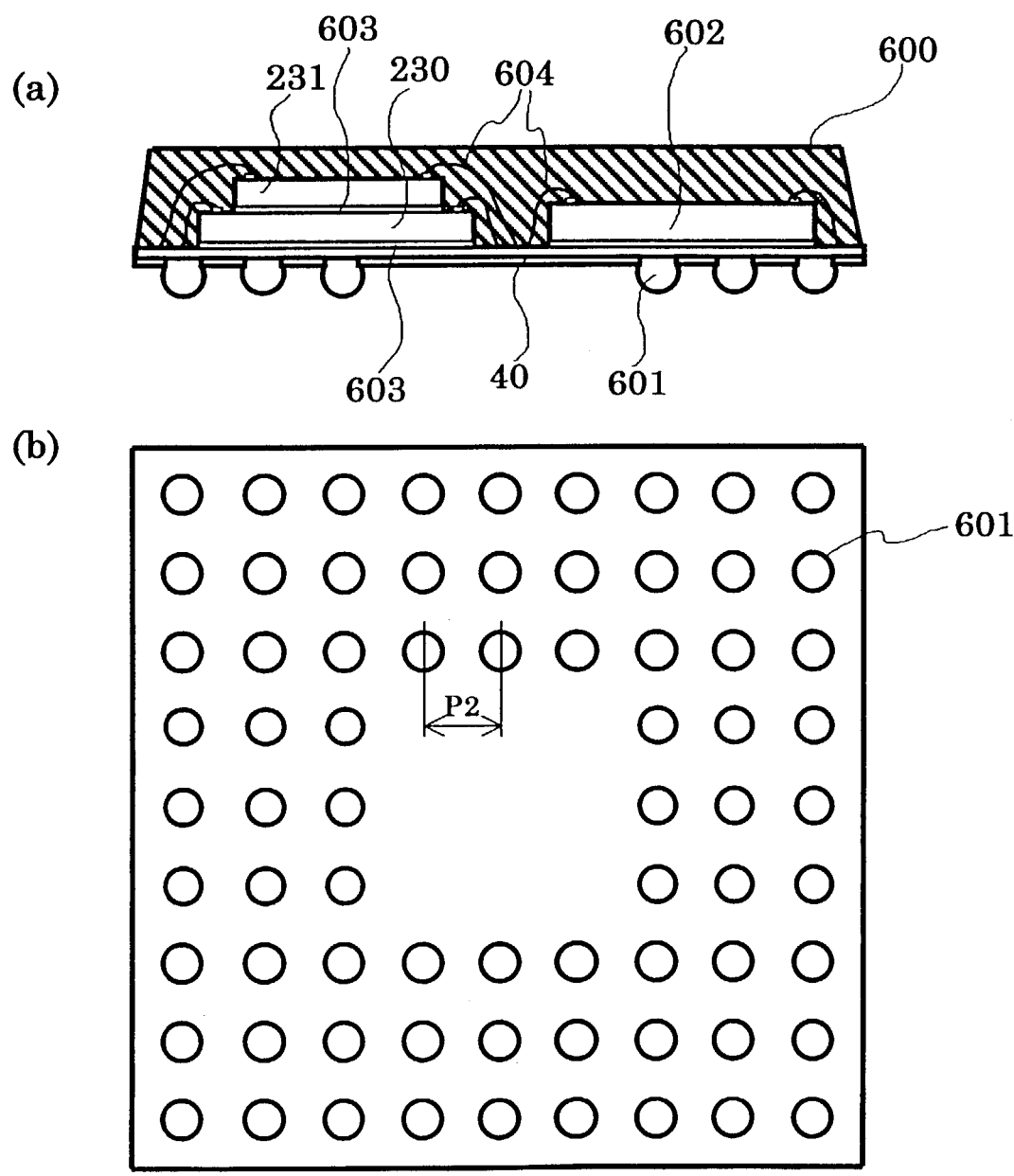
FIGS. 16(a)–(b) are diagrams depicting an example of a configuration of a memory unit module.

As an example illustrative of functions mounted to the memory/logic unit interposer substrate 30, as shown in FIG. 10, a microcomputer (CPU) 220, a DSP 211, a Channel Codec 214, an ADC/DAC 212 for performing conversion between I and Q signals and digital data, a DAC/ADC 213 for performing conversion between PCM data and an analog voice signal, memories (Flash, SRAM, and others) 230 and 231, and an LCD driver 240 are mounted on a main surface of the interposer substrate 30 to constitute an MCM. However, the memories (Flash, SRAM and others) 230 and 231 are different in installed program according to various products and communication protocols. Further, their capacitances also vary in various ways according to user's applications. Therefore, it is also considered that the memories (Flash, SRAM and others) 230 and 231 are accommodated in a single package of an MCP (multi-chip package) form (see FIG. 14) and mounted on the memory/logic unit interposer substrate 30, or the MCP 550 is mounted on the motherboard 50 separately or a discrete memory unit interposer substrate 40 to thereby configure a memory unit module 600 (see FIG. 16).

In the functions mounted to the memory/logic unit interposer substrate 30 shown in FIG. 10, the DAC/ADC 213 for performing conversion between the PCM data and the analog voice signal, and the LCD driver 240 are of components essential for the digital cellular phone. However, when they are used in a general personal digital assistance or the like used as a radio transmitting/receiving device, they might be omitted from the configuration thereof. It is also considered that the ADC/DAC 212 for performing conversion between the I and Q signals and the digital data is integrated into the RF signal processing LSI 161 and mounted on the interposer substrate 10 of the RF signal processing unit module 300 without being mounted on the memory/logic unit interposer substrate 30.

The present memory/logic unit interposer substrate 30 is also provided with a pitch converting function. A minimum terminal pitch P1 between parts mounted to the main surface side is extended to a minimum terminal pitch P2 between external terminals of the interposer substrate 30 to thereby perform pitch conversion. An important point is that the minimum terminal pitch P2 between the external terminals is equivalent to the unified minimum terminal pitch Pu determined according to the predetermined rule or is a value greater than the minimum terminal pitch Pu. Owing to it, the memory/logic unit module 500 can be also mounted onto its corresponding motherboard which satisfies the unified minimum terminal pitch Pu.

(IV) Memory Unit Module 600

The capacity of each memory mounted to the radio transmitting/receiving device is estimated to change in various ways according to specifications and applications. Therefore, when the memories are also mounted to the memory/logic unit module 500, the general versatility of the module (MCM) is considered to be impaired. Thus, it is also considered that they are provided independently. With a view toward packaging a high-capacity memory in compact form, a CSP-type package (MCP) in which memory chips are three-dimensionally stacked on one another, is estimated to increase from now on. Further, it is also considered that an interposer substrate employed in the CSP-type package (MCP) is expanded and a memory unit module (MCM) equipped with other memories and peripheral circuits is used in a radio transmitting/receiving device application on a general-purpose basis.

Figure 14:
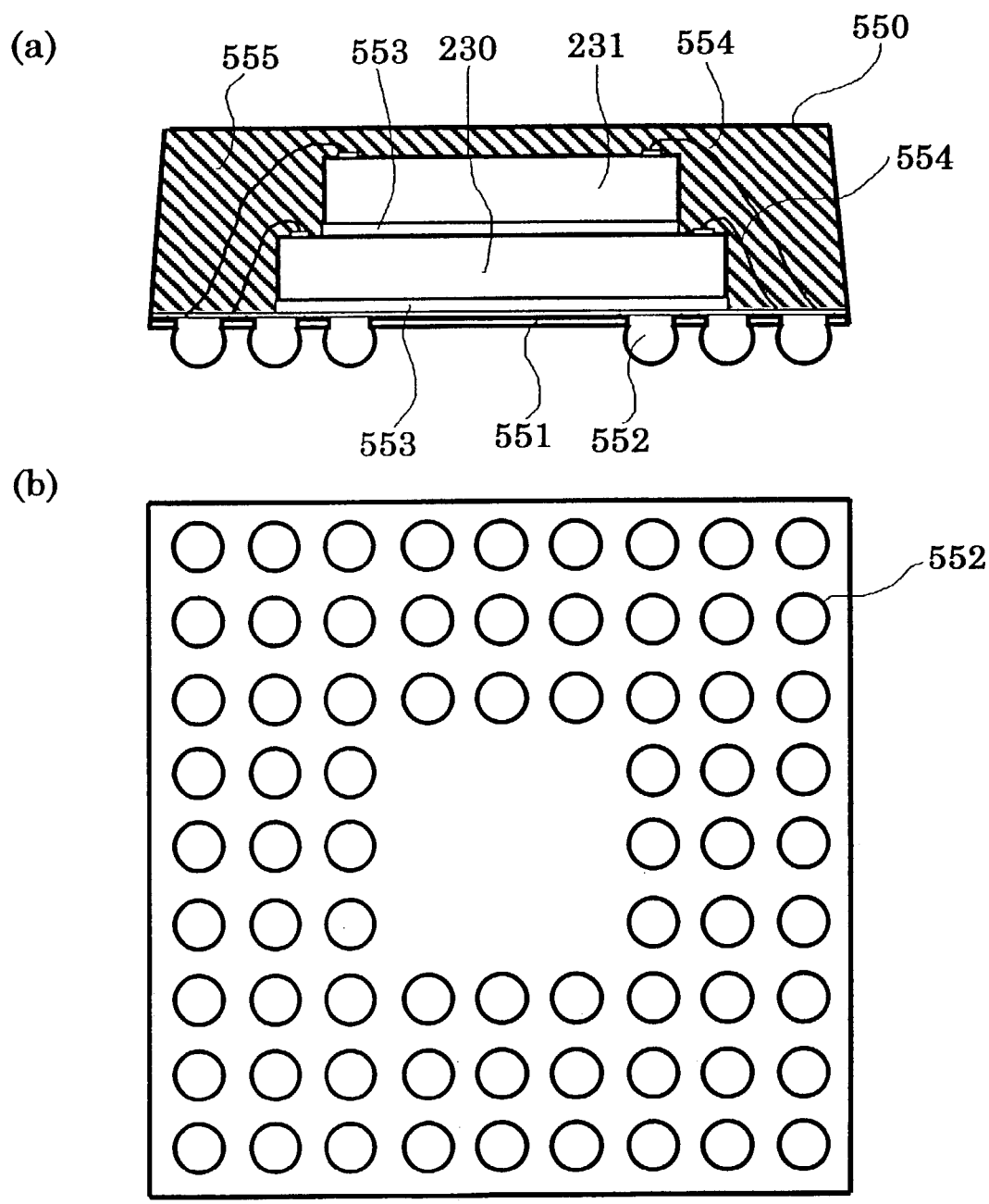
FIGS. 14(a)–(b) are diagrams illustrating an example of a configuration of a memory unit MCP.

FIG. 14 shows an example of a stack type memory unit MCP having a structure of an interposer type CSP. An interposer 551 is a structure having one wiring layer on an insulating layer. Solder balls 552 of bump electrodes extend through the insulating layer so as to be connected to pads at the wiring layer. In FIG. 14, a solder ball diameter (pad diameter) is 0.35 mm and a solder ball pitch is about 0.5 mm. However, the solder ball pitch is estimated to reach about 0.4 mm before long. As a material used for the interposer substrate 551, may be considered, a glass epoxy substrate, a polyimide substrate or the like. Reference numeral 553 indicates an insulating adhesive layer, reference numerals 554 indicate wires, and reference numeral 555 indicates a resin encapsulater, respectively.

FIG. 16(a) shows a typical cross-sectional view of a memory unit module 600 configured such that a plurality of semiconductor parts are horizontally disposed on a main surface of an interposer substrate 40 inclusive of memory chips 230 and 231 provided in a stack configuration. FIG. 16(b) shows an array of bump electrodes 601 formed on the back of the interposer substrate 40. The pitch between the adjacent bump electrodes 601 is about 0.8 mm, for example. As a material used for the interposer substrate 40, may be considered, a glass epoxy substrate, a polyimide substrate or the like. Reference numeral 603 indicates an insulating adhesive layer, reference numerals 604 indicate wires, and reference numeral 602 indicates other memory (SDRAM or the like), respectively.

The present memory unit interposer substrate 40 is also provided with a pitch converting function. A minimum terminal pitch P1 between parts mounted to the main surface side is extended to a minimum terminal pitch P2 between external terminals of the interposer substrate 40 to thereby perform pitch conversion. An important point is that the minimum terminal pitch P2 between the external terminals is equivalent to the unified minimum terminal pitch Pu determined according to the predetermined rule or is a value greater than the minimum terminal pitch Pu. Owing to it, the memory unit module 600 can be also mounted onto its corresponding motherboard which satisfies the unified minimum terminal pitch Pu.

(V) Digital Cellular Phone Comprising RF Signal Processing Unit Module 300, Output Power Unit Module 400 and Memory/Logic Unit Module 500

Figure 1:
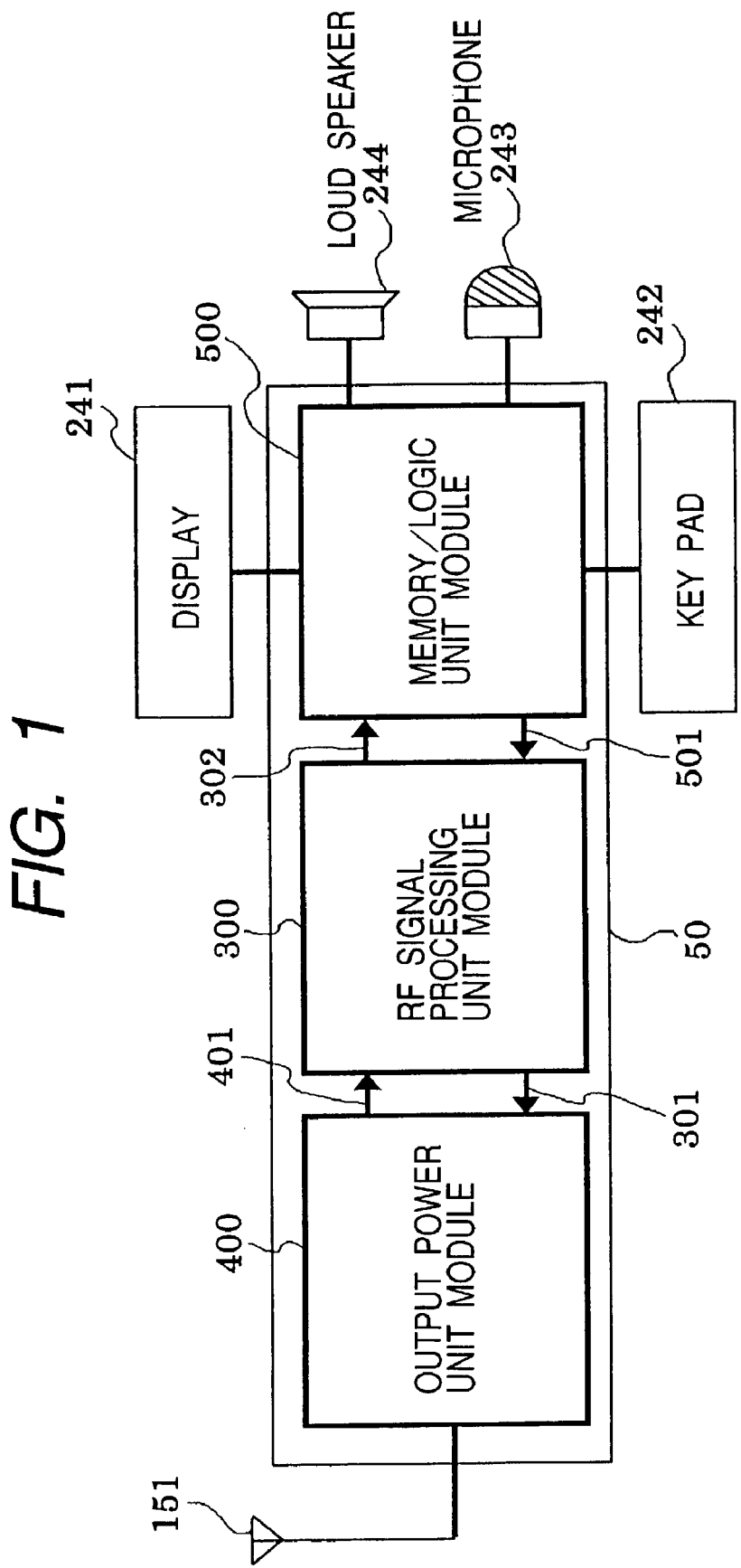
FIG. 1 is a diagram showing an example in which a plurality of types of modules according to the present invention are combined with one another to configure a radio transmitter-receiver system.

According to the invention of the present application, a user prepares a motherboard which satisfies the unified minimum terminal pitch Pu, and disposes and mounts the RF signal processing unit module 300, the output power unit module 400 and the memory/logic unit module 500 (or inclusive of the memory unit module 600 used as a fourth module) in combination and connects them together with component parts such as other power supply portions, etc. thereby making it possible to configure the corresponding digital cellular phone (radio transmitting/receiving device) (see FIG. 1). As to connections on the motherboard 50, a path 401 used for a receive signal received by an antenna and a path 301 for transferring a radio frequency obtained by converting the output of a modulator to its corresponding output power amplifier principally connect between the RF signal processing unit module 300 and the output power unit module 400. A path 302 for transferring a baseband signal demodulated by a demodulator to its corresponding memory/logic unit and a path 501 for transferring a baseband signal produced by the memory/logic unit to the modulator principally connect between the RF signal processing unit module 300 and the memory/logic unit module 500. The memory/logic unit module 500 connects control signals to their corresponding individual units. If a cellular phone is used as an application, for example, then the memory/logic unit module 500 connects to a display 241, a speaker 244, a microphone 243 and a keypad 242 or the like. The output power unit module 400 is connected to the antenna 151.

As described above, the invention of the present application shows a method of disposing a set of component groups divided into the three (or four) modules on the motherboard 50 and configuring a radio transmitter-receiver system on the basis of them, and a radio transmitter-receiver system manufactured by the method.

As the functions mounted to the RF signal processing unit module 300, the output power unit module 400 and the memory/logic unit module 500, semiconductor parts are also considered which are directly mounted on the motherboard 50 without being limited to the above-described examples and being mounted even to any module. Alternatively, novel functions to be added thereto are considered. In either case, the three modules of the RF signal processing unit module, the output power unit module and the memory/logic unit module basically constitute a principal or major part of the radio transmitter-receiver system.

As an example of its modification, may be also considered an example in which the memory unit in the memory/logic unit module is divided into a memory unit module and a logic unit module. In such a case, these four modules constitute the principal part of the radio transmitter-receiver system.

Figure 15:
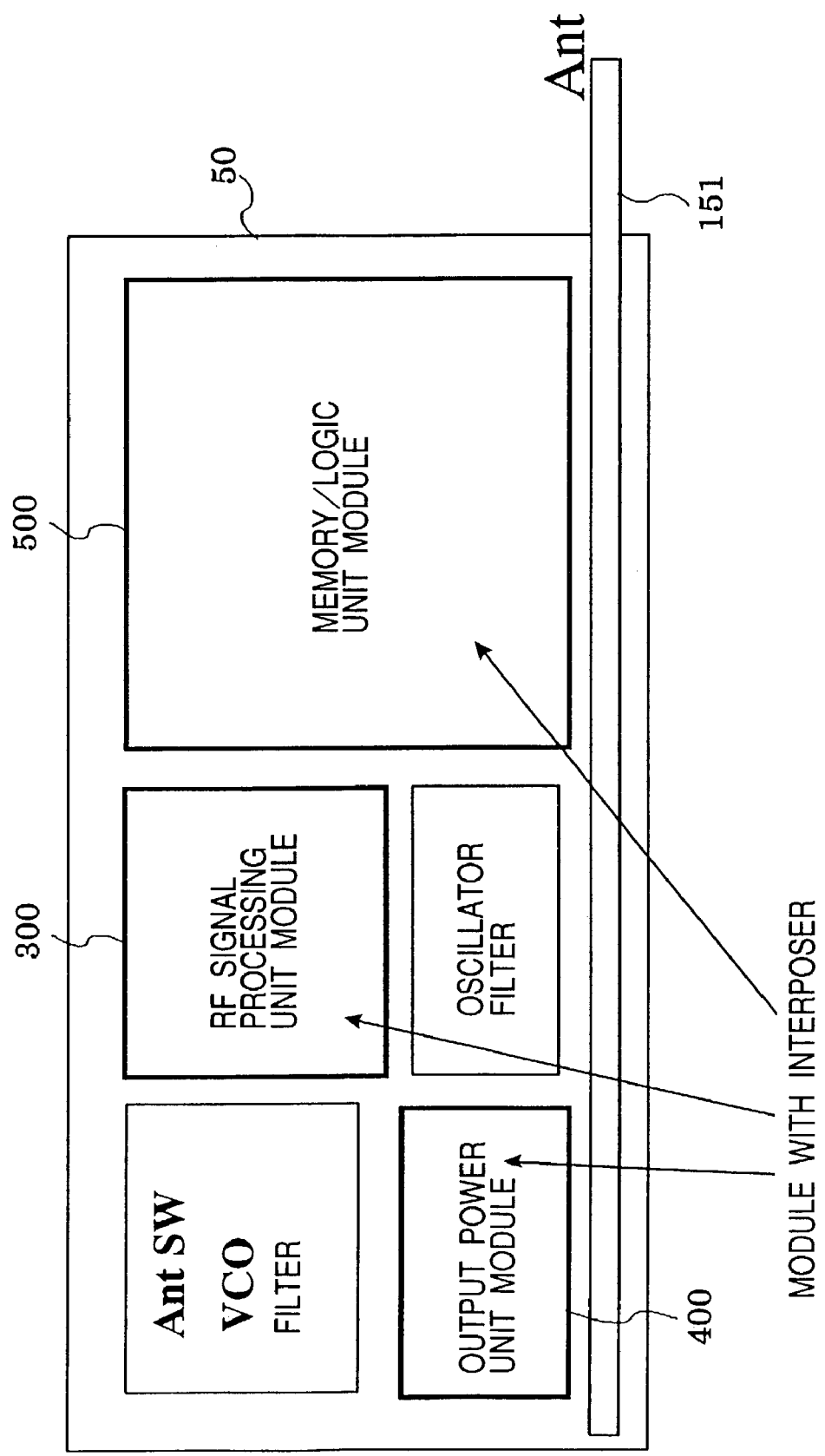
FIG. 15 is a diagram showing an example of a configuration of a portable cellular base PCB.

FIG. 15 shows an example in which three modules are disposed on a main surface of a PCB (motherboard) 50 of a digital cellular phone to configure the corresponding digital cellular phone. An antenna sharing switch (Ant.S/W), a voltage-controlled oscillator (VCO), various filters., and a reference signal oscillator are disposed on the motherboard 50 without being built onto the module.

Since interposers of the respective modules form internal wirings lying between circuits in the respective modules, the required amount of wiring thereof on the PCB (motherboard) 50 through external terminals thereof can be restrained. Owing to pitch converting functions of the interposers, inputs/outputs of semiconductor parts mounted on the interposers, wherein terminal pitches are narrow pitches ranging from 0.15 mm to 0.5 mm, for example, are wired to the external terminals of the interposers so as to be capable of being mounted to a motherboard having terminal pitches ranging from about 0.7 mm to about 1.00 mm. As a result, it is enough that the PCB (motherboard) 50, which satisfies the unified minimum terminal pitch Pu (e.g., about 0.7 mm to about 1.0 mm), is prepared upon design of a new digital cellular phone. The number of wiring layers for the PCB (motherboard) 50 can be less reduced as compared with a case in which all semiconductor parts are directly mounted onto the motherboard 50. The number of the wiring layers can be limited to five layers at most.

In the examples of the respective modules described above, they can be classified into the MCM (multi-chip module) or a module equipped with one LSI chip and a plurality of passive elements, etc. However, while the invention of the present application provides a proposal made under such a base that the functions of the radio transmitting/receiving device are mounted to the three or four types of modules to configure the system on the motherboard, there is no need to limit the modules mentioned herein to the MCM and the like referred to above. Namely, it is considered that the degree of integration of such an MMIC (Monolithic Microwave Integrated Circuit) that active elements and passive elements are formed on the same semiconductor substrate, is further improved, or the degree of integration of such an HMIC (Hybrid Microwave Integrated Circuit) that passive elements and active elements are respectively individually fabricated and they are mounted on the same insulating substrate, is improved, and the functions mounted to the respective modules are integrated into one chip. In such a case, they are estimated to result in such a BGA or CSP-type package that the corresponding chip is mounted on the interposer substrate. Even packages of these forms will be also defined as being included in the modules mentioned in the invention of the present application.

Embodiment 2

Figure 11:
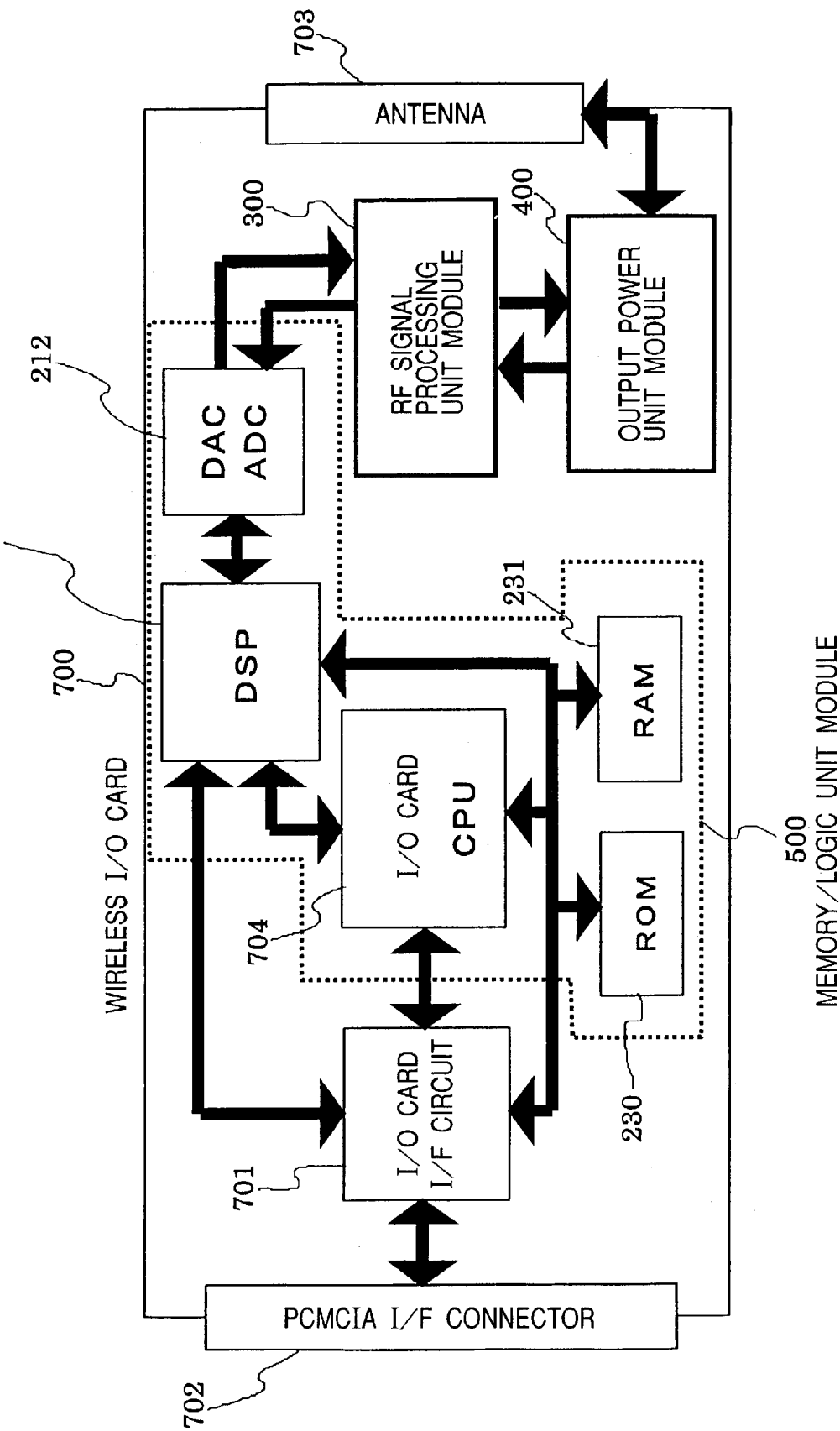
FIG. 11 is a diagram illustrating an example in which a radio transmitting/receiving device according to the invention of the present application is applied to an I/O card with a radio transmitting/receiving function.
Figure 17:
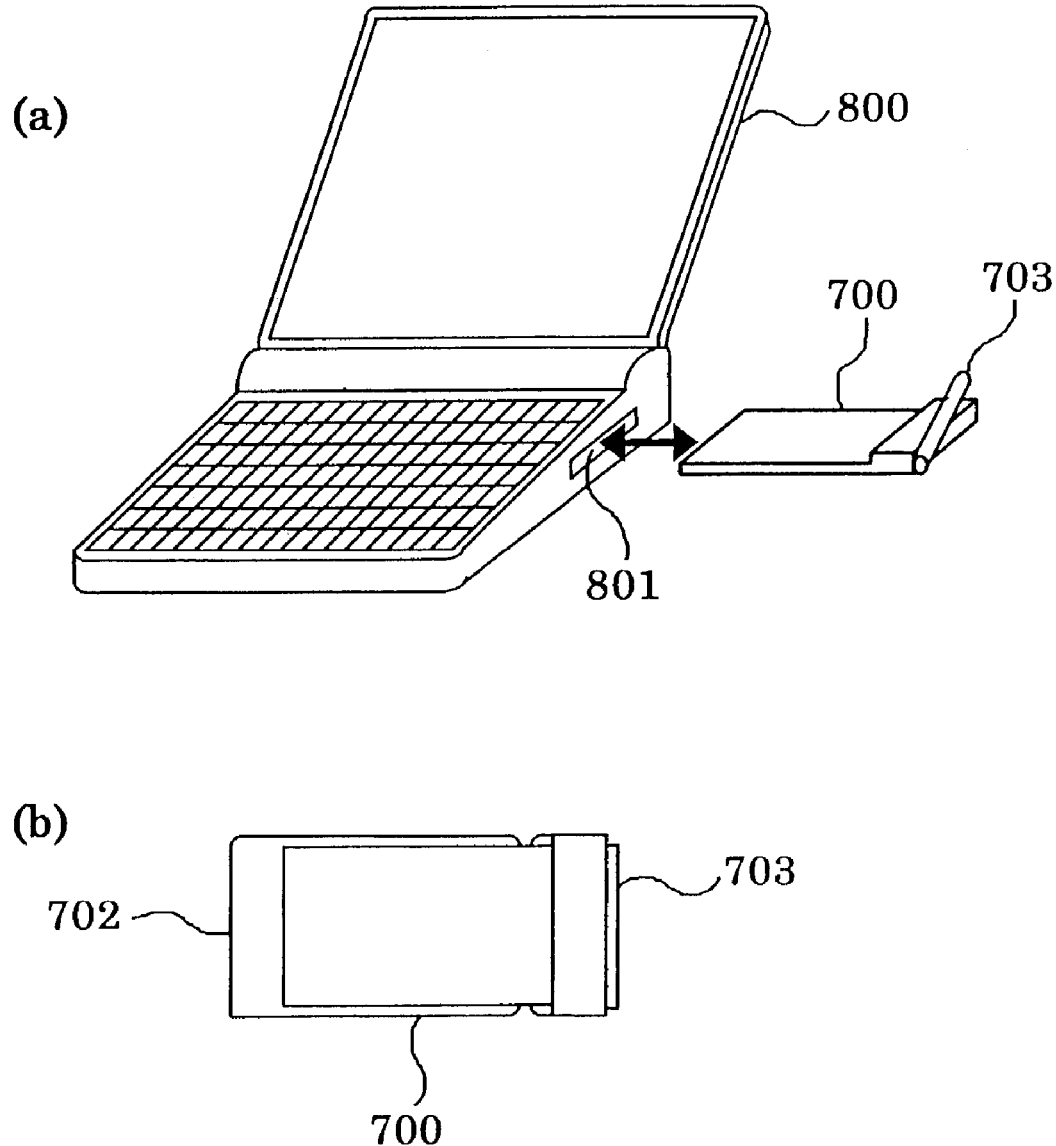
FIGS. 17(a)–(b) are diagrams illustrating an outline of an I/O card with a radio transmitting/receiving function.

FIG. 11 shows an example in which a radio transmitting/receiving device according to the invention of the present application is applied to an I/O card (hereinafter called a "radio communication I/O card") with a radio transmitting/receiving function. The radio communication I/O card is a data communication card for by-radio transmitting and receiving data of a data processing device 800 such as a personal computer or the like as shown in FIG. 17 by way of example. The radio communication I/O card is used with being attached to a PC card slot 801 of the personal computer 800. Physical specifications and electrical specifications of the radio communication I/O card are based on the standards, i.e., PCMCIA2.01, JEIDA4.2, PC Card Standard 97, etc. published by both organizations: PCMCIA (Personal Computer Memory Card International Association) and Nippon Denshi Kogyou Sinkou kyokai (Japan Electronic Industry Development Association: JEIDA)

The shape of the radio communication I/O card may be based on the shape of "Type II Extended" of a PC card, for example, as shown by a top plan view in FIG. 17(*b*) A pin configuration of a 68-pin connector 702 may be also based on an I/O card interface standard. An antenna 703 is provided at the end of the extended portion. The antenna 703 is positioned in a state in which when the radio communication I/O card is attached in the PC card slot 801 of the personal computer, the extended portion and the antenna 703 are peeped outside the slot through a opening of the PC card slot 801.

A block diagram of the interior of a radio communication I/O card 700 is shown in FIG. 11. A PCMCIA I/F connector 702 is of a 68-pin connector connected to its corresponding PC card slot 801 of the personal computer. An I/O card I/F circuit 701 corresponds to an interface circuit including an I/O register which performs the transfer of command/data between the personal computer and the I/O card 700, and a memory for storing attribute information about the card. A radio communication I/O card control CPU 704 is a CPU which performs control on the whole card. A DSP 705 executes functions such as a modem, a fading equalizer, an encoder for various information, a channel encoder, etc. A ROM 230 is a program memory of the CPU 74 or DSP 705. A RAM 231 is mainly as a work area of the CPU 704 or a buffer area for transmit/receive data. A DAC/ADC 212 performs conversion between digital data and I and Q signals. An RF signal processing unit module 300 and an output power unit module 400 correspond to the modules described in the embodiment 1. An antenna part 703 is installed to an end of an extended portion of the I/O card so that the orientation thereof is changeable.

The functions of the radio communication I/O card 700 shown in FIG. 11 are represented in the following manner, for example after the PC card slot 801 of the personal computer has been loaded with the card. The radio communication I/O card attached in the slot is recognized according to an interface function mounted to the personal computer to read attribute information about the card, after which it is notified to its corresponding application program.

When the application program in the personal computer performs data communications, it issues a command for calling instructions, which is written into an I/O register in the I/O card I/F circuit 701 through the PCMCIA I/F connector 702. When the radio communication I/O card CPU 704 reads this command and recognizes the calling instruction command, it notifies a calling request and a number of a called party to a base station. According to information about an available communication channel sent from the base station, the radio communication I/O card CPU 704 uses the communication channel to call out the called party and waits for response of the called party, thereby establishing a radio circuit or link. After the establishment of the radio link, the radio communication I/O card CPU 704 confirms the completion of establishment of a data link to the called party and transfers the completion of connection to the application program in the personal computer. A data communication is started through a data communication channel between terminals.

Since the circuit switching system for establishing one radio channel and performing the data communication between the terminals as described above monopolizes the channel even when no information is actually provided, the use efficiency of the link might be extremely degraded. While the circuit switching system is advantageous where the amount of transmitted information is massive like file transfer, a packet switching system is used for data communications other than it. In the packet exchange system, information to be transmitted is divided into "lumps" each having a proper length. Packets added with necessary control information such as destinations and transmission turns or the like sent to the individual packets are formed. The packet switching system performs communications with the packets as units. A base station stores and exchanges (await) packets sent from a plurality of terminals and sequentially sends the corresponding packets to a plurality of terminals. In this case, a channel is shared between a plurality of communications.

When the communications are ended and the channel is cut off, the application program issues a cut-off instruction command, which is written into the I/O register in the I/O card I/F circuit 701 in a similar to the above. When the radio communication I/O card CPU 704 reads this command and recognizes it as the cut-off instruction command, the radio communication I/O card CPU 704 instructs the cut-off of a data communication channel to release the channel.

Functions to be processed by the DSP 705 are considered to vary in various ways according to the difference in communication system, the contents of transmitted and received multimedia data, and the way of separating realized functions on the portable device side and realized functions on the network side. Principal functions are as follows:

(1) A fading equalizer corresponding to a filter for simultaneously combining and receiving many radio waves (multiple waves) different in radio propagation path with respect to mobile stations to thereby compensate for degradation developed due to code-to-code interference attributable to the occurrence of received-level change (fading) caused by distortion of amplitude and phases thereof.

(2) A voice encoder used when a personal computer transmits and receives voice data. A still/motion picture encoder used when still/motion pictures are transmitted and received.

(3) An error correcting encoder (channel encoder) for protecting data from a transmission error.

(4) An echo canceller corresponding to an adaptive filer typical in a manner similar to an equalizer.

(5) Et cetera: a modem having a modulation/demodulation processing function.

Since the functions executed by the DSP 705 as described above are different according to the communication systems or the like, programs therefor are stored in a memory located inside the DSP 705 or the ROM 230. When it is necessary to switch the communication systems or the like by selection, for example, the personal computer is used to send a communication-system instruction command to the I/O card, and the CPU 704 recognizes the command and the personal computer executes down loading of a program into the ROM 230 when a new communication system is taken. As the ROM 230 for storing the programs executed by the CPU 704 and the DSP 705, is used, an erasable/rewritable flash memory or the like.

The radio communication I/O card control CPU 704, DSP 705, ROM 230, RAM 231 and DAC/ADC 212 mounted to the above-described radio communication I/O card 700 are common to the components mounted onto the memory/logic unit module 500 disclosed in the embodiment 1. While functions different from those of the DSP 211 according to the embodiment 1 are considered as the functions executed by the DSP 705 according to the present embodiment, the latter functions are executed according to program switching. The provision of the dedicated hardware 214 as described in the embodiment 1 is also considered with respect to the process related to the error correcting encoder (channel encoder) in the functions of the DSP 705.

Even in the present embodiment in a similar to the embodiment 1, the RF signal processing unit module 300, the output power unit module 400 and the memory/logic unit module 500 are disposed and mounted on the motherboard 50 in combination, whereby a radio transmitting/receiving function can be configured for the I/O card 700.

INDUSTRIAL APPLICABILITY

As described above, a radio transmitting/receiving device according to the invention of the present application, wherein main components (functions) thereof are mounted on three or four types of modules in parts with an interposer having a terminal pitch converting function as a substrate, is provided for a user. Without specifically preparing a CSP or a flip chip-adaptable high wiring density, a narrow terminal pitch, and a multilayered motherboard, the user disposes the plurality of types of modules on a motherboard having a minimum terminal pitch that satisfies the above-described predetermined rule to thereby be able to configure the corresponding radio transmitting/receiving device. Further, the number of wiring layers for the motherboard can be less reduced as compared with a case in which all semiconductor parts are directly mounted onto the motherboard 50 without adopting the plurality of types of modules.

Owing to the adoption of the modules according to the invention of the present application, the user is capable of reducing the number of parts mounted on the motherboard and incorporating a radio transmitting/receiving device into its own product without bearing a burden on the design of a high frequency circuit. Further, a reduction in manufacturing cost and yield improvements can be achieved.

The invention claimed is:

1. A radio transmitting/receiving device, comprising:
a first module on which a function for amplifying a received radio frequency signal, demodulating the amplified radio frequency signal to a baseband signal and outputting the same, and a function for modulating the input baseband signal, converting the modulated baseband signal to a radio frequency and outputting the same are mounted;
a second module on which a function for amplifying an input radio frequency to output power is mounted; and
a third module on which a function for executing a baseband signal process and for controlling respective units according to a transmission/reception sequence based on a communication protocol is mounted,
wherein said first, second and third modules are mounted onto a motherboard;
wherein said first module and said second module are comprised of an analog circuit;
wherein said third module is comprised of a digital circuit;
wherein each of the first, second and third modules is provided with an interposer substrate wherein terminals of semiconductor parts mounted on the main surface side thereof and external terminals disposed on the back side thereof are pitch-converted and thereby connected to one another; and
wherein in a layout of the external terminals of the first module, the external terminals for high-frequency signals are arranged on an outermost periphery thereof, and the external terminals for power supplies and control signals are arranged in the layout on an inner side thereof.

2. The radio transmitting/receiving device according to claim 1,
wherein a fourth module on which memories are mounted thereof is mounted onto the motherboard.

3. A radio transmitting/receiving device, comprising:
a first module on which a function for amplifying a received radio frequency signal, demodulating the amplified radio frequency signal to a baseband signal and outputting the same, and a function for modulating the input baseband signal, converting the modulated baseband signal to a radio frequency and outputting the same are mounted;
a second module on which a function for amplifying an input radio frequency to output power is mounted; and
a third module on which a function for executing a baseband signal process and for controlling respective units according to a transmission/reception sequence based on a communication protocol is mounted, wherein said first, second and third modules are mounted onto a motherboard;

wherein said first module and said second module are comprised of an analog circuit;

wherein said third module is comprised of a digital circuit;

wherein each of the first, second and third modules is provided with an interposer substrate wherein terminals of semiconductor parts mounted on the main surface side thereof and external terminals disposed on the back side thereof are pitch-converted and thereby connected to one another; and wherein in a layout of the external terminals of the second module, high-frequency analog signals are provided for the external terminals arranged in the layout around the outermost periphery thereof along the respective sides of the second module.

4. The radio transmitting/receiving device according to claim 3, wherein a fourth module on which memories are mounted thereof is mounted onto the motherboard.

5. A radio transmitting/receiving device, comprising:

a motherboard;

a first module, a second module, and a third module each being mounted on the motherboard;

the first module having a function for demodulating a received radio frequency signal to a first baseband signal, and a function for modulating an input second baseband signal to a radio frequency;

the second module having a function for amplifying the radio frequency input from the first module to an output power; and the third module having a function for converting the first baseband signal input from the first module to a first digital data, a function for processing the first digital data and a transmitting second digital data, and a function for converting the second digital data to the second baseband signal, wherein the first module and the second module are comprised of an analog circuit;

wherein the third module is comprised of a digital circuit;

wherein each of the first, second and third modules is provided with an interposer substrate wherein terminals of semiconductor parts mounted on the main surface side thereof and external terminals disposed on the back side thereof are pitch-converted and thereby connected to one another; and wherein in a layout of external terminals of the first module, a plane dimension of the external terminals disposed on the outer peripheral side of the first module are set in such a manner that a plane dimension of each external terminal in the direction to intersect the side of the first module become larger than a plane dimension thereof in the direction to be parallel to the side of the first module.

6. The radio transmitting/receiving device according to claim 5, wherein a fourth module on which memories are mounted thereof is mounted onto the motherboard.

7. A radio transmitting/receiving device, comprising:

a motherboard;

a first module, a second module, and a third module each being mounted on the motherboard;

the first module having a function for demodulating a received radio frequency signal to a first baseband signal, and a function for modulating an input second baseband signal to a radio frequency;

the second module having a function for amplifying the radio frequency input from the first module to an output power; and the third module having a function for converting the first baseband signal input from the first module to a first digital data, a function for processing the first digital data and a transmitting second digital data, and a function for converting the second digital data to the second baseband signal, wherein the first module and the second module are comprised of an analog circuit;

wherein the third module is comprised of a digital circuit;

wherein each of the first, second and third modules is provided with an interposer substrate wherein terminals of semiconductor parts mounted on the main surface side thereof and external terminals disposed on the back side thereof are pitch-covered and thereby connected to one another; and wherein in a layout of external terminals of the first module, the external terminals disposed in the neighborhood of the corners on the outer peripheral side of the first module are larger than other external terminals and identical in length-to-width dimensional ratio.

8. The radio transmitting/receiving device according to claim 7, wherein a fourth module on which memories are mounted thereof is mounted onto the motherboard.

* * * * *